(12) United States Patent
Kwon et al.

(10) Patent No.: US 12,029,104 B2
(45) Date of Patent: *Jul. 2, 2024

(54) DISPLAY DEVICE AND METHOD FOR MANUFACTURING THE SAME

(71) Applicant: SAMSUNG DISPLAY CO., LTD., Yongin-si (KR)

(72) Inventors: Seungwook Kwon, Hwaseong-si (KR); Jaesik Kim, Hwaseong-si (KR); Woo Yong Sung, Seoul (KR); Seoyeon Lee, Namyangju-si (KR); Ung-Soo Lee, Seoul (KR); Jamin Lee, Seoul (KR); Jeongseok Lee, Yongin-si (KR); Sehoon Jeong, Suwon-si (KR); Seunggun Chae, Hwaseong-si (KR); Seung-Yeon Chae, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/173,774

(22) Filed: Feb. 23, 2023

(65) Prior Publication Data
US 2023/0209983 A1 Jun. 29, 2023

Related U.S. Application Data

(63) Continuation of application No. 17/212,933, filed on Mar. 25, 2021, now Pat. No. 11,594,693.

(30) Foreign Application Priority Data
Aug. 12, 2020 (KR) .......................... 10-2020-0101024

(51) Int. Cl.
*H10K 77/10* (2023.01)
*B32B 3/04* (2006.01)
(Continued)

(52) U.S. Cl.
CPC .............. *H10K 77/111* (2023.02); *B32B 3/04* (2013.01); *B32B 37/18* (2013.01); *B32B 38/145* (2013.01);
(Continued)

(58) Field of Classification Search
CPC .. H10K 77/111; H10K 50/841; H10K 50/844; H10K 50/87; H10K 59/12;
(Continued)

(56) References Cited

U.S. PATENT DOCUMENTS 9,812,659 B2 11/2017 Kwon et al.
10,164,208 B2 12/2018 Lee et al.
(Continued)

FOREIGN PATENT DOCUMENTS

KR 10-2018-0079091 A 7/2018
KR 10-2019-0069075 A 6/2019
(Continued)

*Primary Examiner* — J. E. Schoenholtz
(74) *Attorney, Agent, or Firm* — Lewis Roca Rothgerber Christie LLP

(57) ABSTRACT

A display device includes a base layer including first and second portions, and a third portion between the first and second portions and configured to be bent, folded, or rolled, a light emitting element layer on one surface of the base layer at the first portion, and including light emitting elements, a circuit board on the one surface of the base layer at the third portion, and electrically connected to the light emitting elements, protective patterns spaced apart from each other on another surface of the base layer, including a resin, and also including first protective patterns spaced apart from each other on the other surface of the base layer at the first portion, and at least one second protective pattern on the other surface of the base layer at the second portion, and at least one of a heat dissipation layer or a cushion layer below the protective patterns.

18 Claims, 31 Drawing Sheets

(51) Int. Cl.
  *B32B 37/18* (2006.01)
  *B32B 38/00* (2006.01)
  *H10K 50/84* (2023.01)
  *H10K 50/844* (2023.01)
  *H10K 50/87* (2023.01)
  *H10K 59/12* (2023.01)
  *H10K 71/00* (2023.01)
  *H10K 102/00* (2023.01)

(52) U.S. Cl.
  CPC ......... *H10K 50/841* (2023.02); *H10K 50/844* (2023.02); *H10K 50/87* (2023.02); *H10K 59/12* (2023.02); *H10K 71/00* (2023.02); *B32B 2457/20* (2013.01); *H10K 59/1201* (2023.02); *H10K 2102/311* (2023.02)

(58) Field of Classification Search
  CPC ............... H10K 71/00; H10K 59/1201; H10K 2102/311; B32B 3/04; B32B 37/18; B32B 38/145; B32B 2457/20; B32B 27/32; B32B 2250/44; B32B 23/00; B32B 27/283; B32B 27/325; B32B 2255/26; B32B 2307/546; B32B 2307/7244; B32B 2307/7246; B32B 7/12; B32B 27/30; B32B 27/308; B32B 27/34; B32B 27/38; B32B 27/40; B32B 27/281; Y02E 10/549; G09F 9/301; G06F 1/1641; G06F 1/1652; G06F 2203/04102

See application file for complete search history.

(56) References Cited

U.S. PATENT DOCUMENTS

| | | | |
|---|---|---|---|
| 10,755,991 B2 | 8/2020 | Park et al. | |
| 11,594,693 B2* | 2/2023 | Kwon | H10K 50/841 |
| 2015/0062467 A1* | 3/2015 | Kang | G06F 3/0446 |
| | | | 349/12 |
| 2016/0084994 A1 | 3/2016 | Namkung | |
| 2020/0091445 A1 | 3/2020 | Kwon et al. | |
| 2020/0111992 A1 | 4/2020 | Kwon et al. | |
| 2020/0158918 A1 | 5/2020 | Namkung | |
| 2020/0396837 A1* | 12/2020 | Tian | H10K 59/12 |
| 2021/0132724 A1 | 5/2021 | Kwon et al. | |
| 2023/0075372 A1* | 3/2023 | Xu | H10K 59/128 |

FOREIGN PATENT DOCUMENTS

| | | |
|---|---|---|
| KR | 10-2020-0019000 A | 2/2020 |
| KR | 10-2020-0032794 A | 3/2020 |

\* cited by examiner

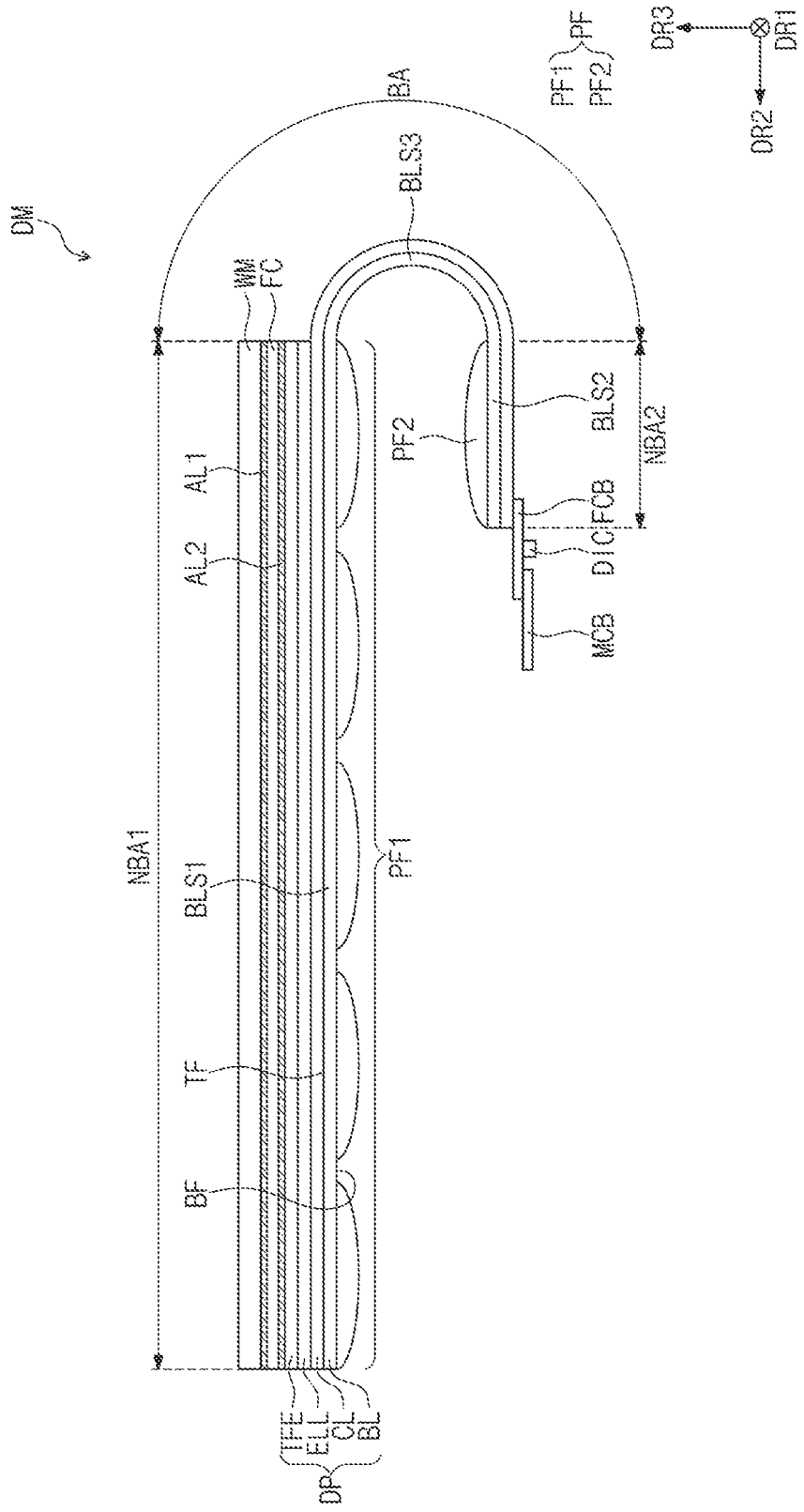

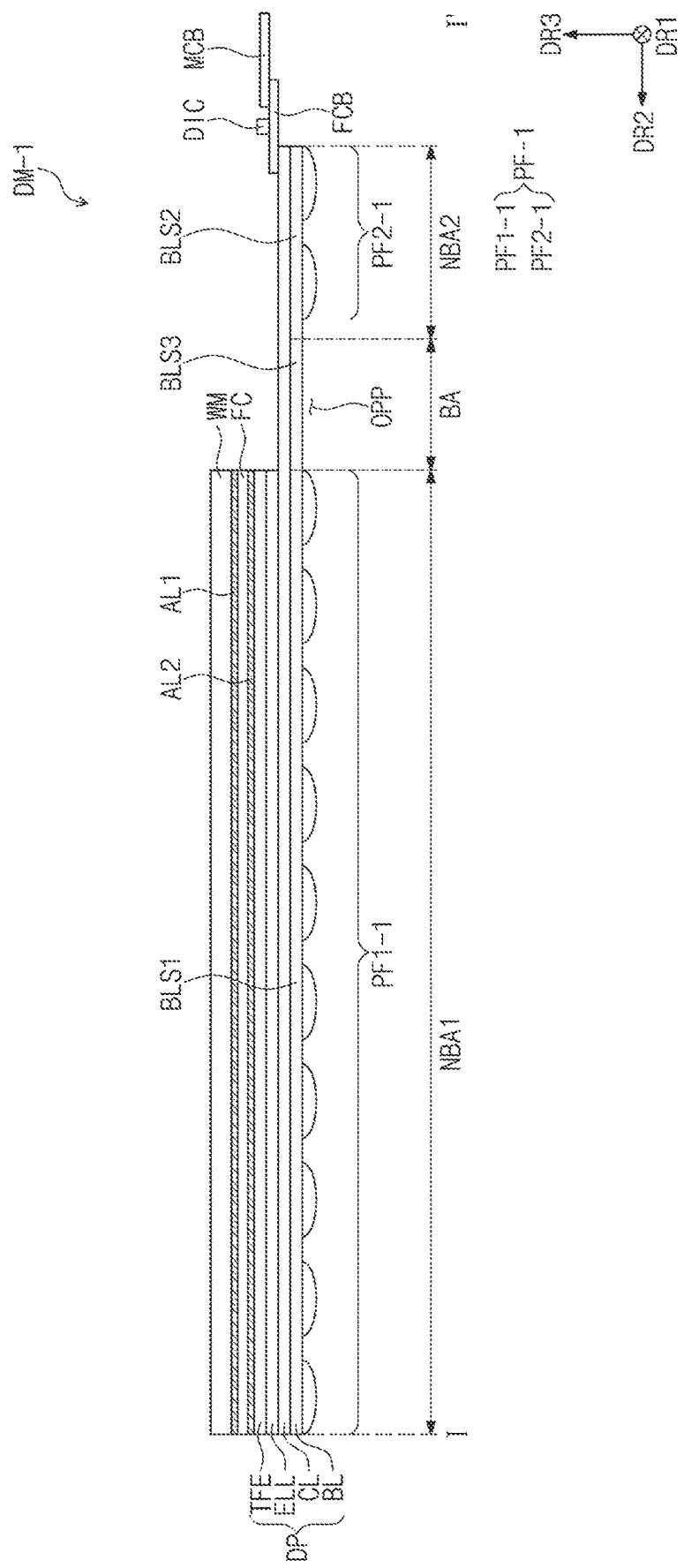

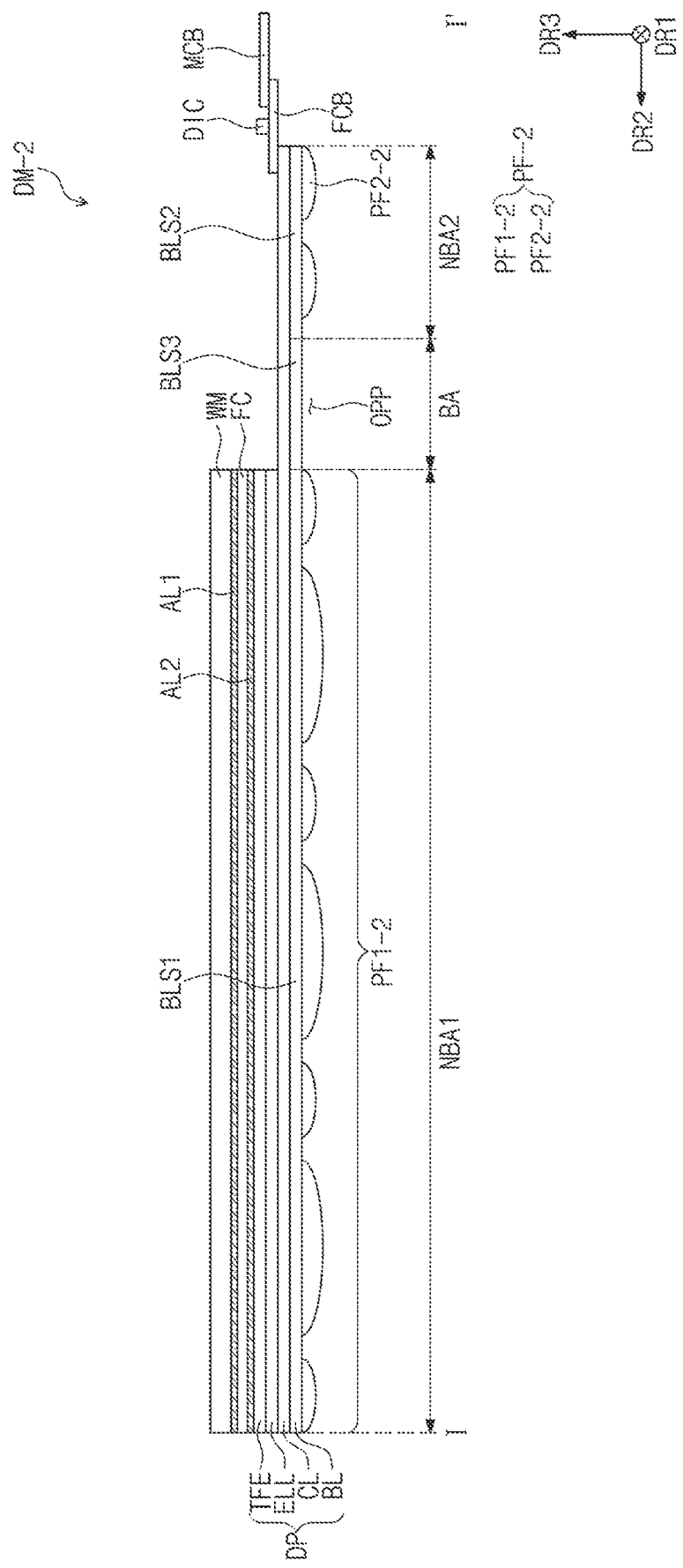

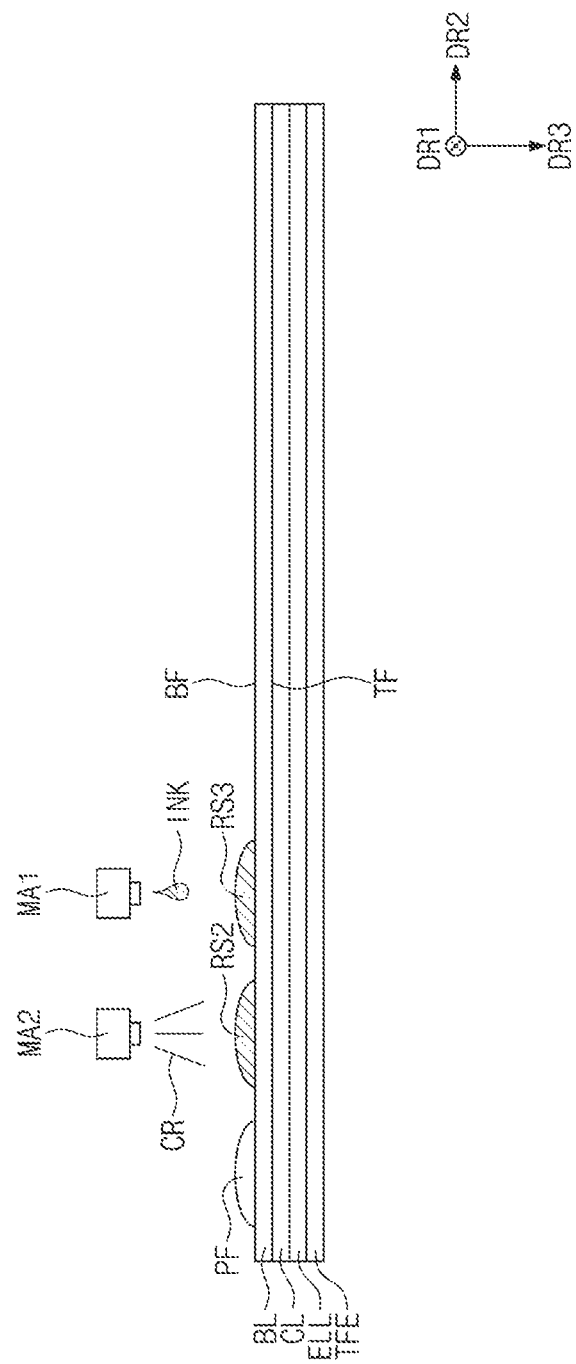

DISPLAY DEVICE AND METHOD FOR MANUFACTURING THE SAME

CROSS-REFERENCE TO RELATED APPLICATIONS

This application is a continuation of U.S. patent application Ser. No. 17/212,933, filed Mar. 25, 2021, which claims priority to and the benefit of Korean Patent Application No. 10-2020-0101024, filed Aug. 12, 2020, the entire content of both of which is incorporated herein by reference.

BACKGROUND

The present disclosure herein relates to a display panel of which at least a portion may be folded, and a display device including the same. In addition, the present disclosure herein relates to a method for manufacturing a display device that may be folded.

A display device displays various images on a display screen to provide information to a user. In general, a display device displays information within an assigned screen. In recent years, a flexible display device including a foldable flexible display panel is being developed. The flexible display device may be foldable, rollable, or bendable, unlike a rigid display device. The flexible display device that is capable of being variously changed in shape may be portable regardless of a size of an existing screen to improve user's convenience.

The display device includes a display panel, and a film for protecting or supporting the display panel may be located under the display panel.

Due to a thickness of the film, when a portion of the display panel is folded, portions of the film may contact each other to be potentially damaged.

SUMMARY

The present disclosure provides a display device having a structure in which a protective pattern located below a display panel is not damaged when a portion of the display panel is folded.

Some embodiments of the present disclosure provide a display device including a base layer including a first portion, a second portion, and a third portion between the first portion and the second portion and configured to be bent, folded, or rolled, a light emitting element layer on one surface of the base layer at the first portion, and including light emitting elements, a circuit board on the one surface of the base layer at the third portion, and electrically connected to the light emitting elements, protective patterns spaced apart from each other on another surface of the base layer, including a resin, and also including first protective patterns spaced apart from each other on the other surface of the base layer at the first portion, and at least one second protective pattern on the other surface of the base layer at the second portion, and at least one of a heat dissipation layer or a cushion layer below the protective patterns.

The protective patterns may contact the other surface of the base layer.

The base layer may have a short side extending in a first direction, and a long side extending in a second direction crossing the first direction, wherein the protective patterns are spaced part from each other in the second direction.

Each of the protective patterns may have a circular shape on a plane.

The protective patterns may be spaced apart from each other in a first direction, and in a second direction.

The protective patterns may be spaced apart from each other in a direction between a first direction and a second direction crossing the first direction, and in the second direction.

The protective patterns might not be on the other surface of the base layer at the third portion.

The protective patterns may further include third protective patterns spaced apart from each other on the other surface of the third portion, wherein the first to third protective patterns have a circular shape, wherein a density per unit area of the first protective patterns is substantially the same as a density per unit area of the at least one second protective pattern, and wherein a density per unit area of the third protective patterns is less than a density per unit area of the first protective patterns.

The protective patterns may further include a connection protection pattern on a portion of the first portion adjacent to the third portion, and on a portion of the third portion adjacent to the first portion.

Each of the protective patterns may extend in a first direction, may have an arch shape in a cross-section, and may be spaced apart from each other in a second direction crossing the first direction.

The protective patterns may have the same area on a plane.

At least one of the protective patterns may have a width in the second direction that is different from that of others of the protective patterns.

The display device may further include a window on the light emitting element layer and the base layer.

The base layer may be flexible.

At least a portion of the first portion may be folded or wound.

In some embodiments of the present disclosure, a method for manufacturing a display device includes a preparation process of laminating a circuit layer and a light emitting element layer on one surface of a base layer, a dropping and adhering process of allowing an organic composition to drop and adhere to another surface of the base layer to form an organic pattern, and a curing process of curing the organic pattern.

The dropping and adhering process may include a process of forming a first organic pattern on the other surface of the base layer in an inkjet manner.

The curing process may include a process of curing the first organic pattern.

The method may further include a dropping and adhering process of forming a second organic pattern spaced apart from the first organic pattern, and a curing process of curing the second organic pattern.

In some embodiments of the present disclosure, a display device includes a base layer on which a bending area, and a peripheral area adjacent to the bending area, are defined, a light emitting element layer on one surface of the base layer, and protective patterns contacting another surface of the base layer, and spaced apart from each other, wherein a density per unit area of the protective patterns on the bending area is less than a density per unit area of the protective patterns on the peripheral area.

BRIEF DESCRIPTION OF THE FIGURES

The accompanying drawings are included to provide a further understanding of the present disclosure, and are incorporated in and constitute a part of this specification.

The drawings illustrate embodiments of the present disclosure and, together with the description, serve to explain aspects of the present disclosure. In the drawings:

FIG. 4C is a cross-sectional view illustrating a state in which the display module of FIG. 4B is bent or folded according to some embodiments of the present disclosure;

FIG. 5B is a cross-sectional view taken along the line I-I' of FIG. 3;

FIG. 6B is a cross-sectional view taken along the line I-I' of FIG. 3;

FIGS. 21A, 21B, 21C, 21D, 21E, and 21F are views illustrating processes of the method for manufacturing the display device according to some embodiments of the present disclosure, respectively.

DETAILED DESCRIPTION

Figure 1:
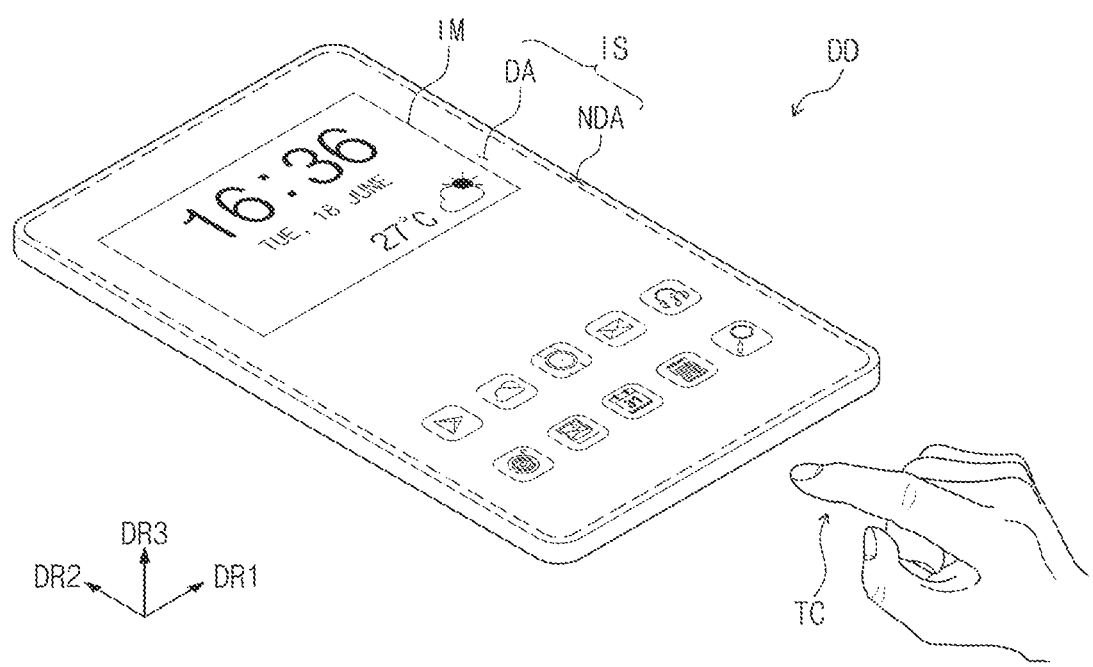
FIG. 1 is a coupling perspective view of a display device according to some embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described. Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section.

Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a display device DD and a method for manufacturing the display device DD according to the present disclosure will be described with reference to the drawings.

FIG. 1 is a coupling perspective view of the display device DD according to some embodiments of the present disclosure.

Referring to FIG. 1, the display device DD according to some embodiments may include a display surface IS that is parallel to each of a first direction DR1 and a second direction DR2. The display surface IS may display an image IM toward a third direction DR3. The display surface IS on which the image IM is displayed may correspond to a front surface of the display device DD.

In FIG. 1, a smart phone is illustrated as some embodiments of the display device DD, but the embodiments of the present disclosure are not limited thereto. The display device DD according to some embodiments of the present disclosure may be used for large-sized electronic apparatuses such as televisions and monitors and small and middle-sized electronic apparatuses such as tablet PCs, navigation systems for vehicles, game consoles, and smart watches. The above-described equipment are merely an example and thus, the electronic apparatus ED may be adopted for other electronic equipment unless departing from the spirit and scope of the present disclosure.

As illustrated in FIG. 1A, the display surface IS of the display device DD may include a plurality areas. The display surface IS of the display device DD may be divided into a plurality of areas. A display area DA and a non-display area NDA may be defined on the display surface IS of the display device DD.

The display area DA may be an area on which an image IM is displayed, and a user may see the image IM through the display area DA. The display area DA may have a rectangular shape. The non-display area NDA may surround the display area DA. Thus, the shape of the display area DA may be substantially defined by the non-display area NDA. However, this is merely an example. For example, in other embodiments, the non-display area NDA may be located adjacent to only one side of the display area DA, or may be omitted.

The non-display area NDA is an area that is adjacent to the display area DA, and on which the image IM is not displayed. A bezel area of the display device DD may be defined by the non-display area NDA.

The non-display area NDA may surround the display area DA. However, this is merely an example. For example, in other embodiments, the non-display area NDA may be located adjacent to only a portion of an edge of the display area DA.

The display device DD according to some embodiments of the present disclosure may sense a user's externally applied input TC. The user's input TC may include various types of external inputs, such as a portion of user's body, light, heat, a pressure, or the like. In some embodiments, the user's input TC is illustrated as a user's hand applied to the front surface. However, this is merely an example. As described above, the user's input TC may be provided in various forms (for example, input using a user's hand, input using a mechanism such as a touch pen or a stylus pen, and the like). Also, the display device DD may sense the user's input TC applied to a side surface or to a rear surface of the display device DD according to the structure of the display device DD.

The display device DD may activate the display surface IS to display the image IM and may also sense the input TC. In some embodiments, an area on which the input TC is sensed may be provided on the display area DA on which the image IM is displayed. However, this is merely an example. For example, the area on which the input TC may be provided on the non-display area NDA, or may be provided on an entire area of the display surface IS.

Figure 2:
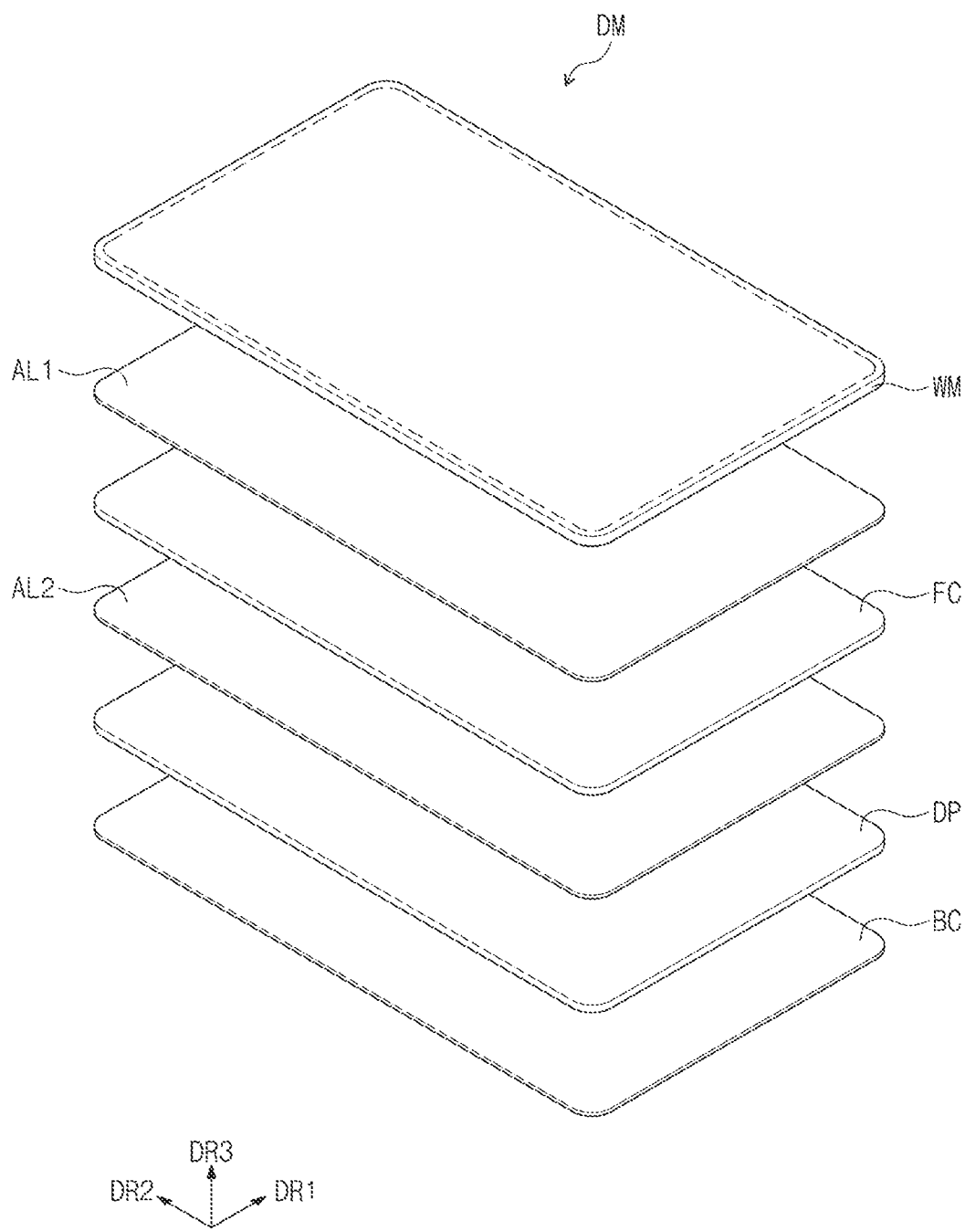
FIG. 2 is an exploded perspective view of a display module according to some embodiments of the present disclosure.
Figure 3:
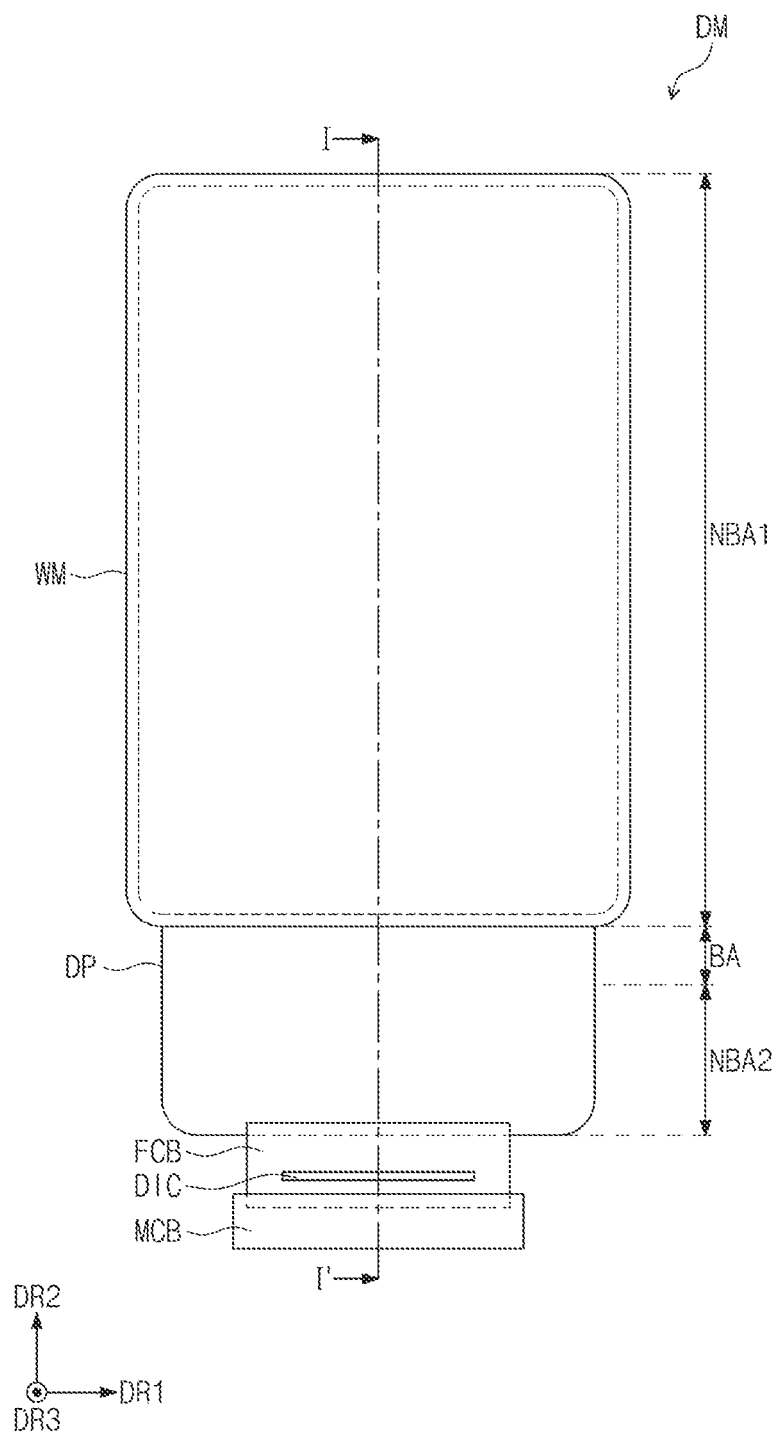
FIG. 3 is a plan view of the display module according to some embodiments of the present disclosure.

FIG. 2 is an exploded perspective view of the display module DM according to some embodiments of the present disclosure, and FIG. 3 is a perspective view of the display module DM according to some embodiments of the present disclosure.

Referring to FIG. 2, the display device DD according to some embodiments of the present disclosure may include a display panel DP on which an image is displayed, and a window WM located on the display panel DP.

The display panel DP may be an organic light emitting diode display panel, a quantum dot display panel, a liquid crystal display panel, a plasma display panel, an electrophoretic display panel, a microelectromechanical system (MEMS) display panel, and/or an electrowetting display panel.

A top surface of the window module WM may define the display surface IS of the display device DD illustrated in FIG. 1. The window WM may be optically transparent. Thus, an image generated in the display panel DP may pass through the window WM to be recognized by the user.

The window WM may be made of a flexible material. Thus, the window WM according to some embodiments be folded or unfolded. Thus, when the display panel DP is folded or unfolded, the shape of the window WM may be changed as well.

The window WM may protect the display panel DP by transmitting the image generated by the display panel DP while also alleviating an external impact. For example, the window WM may reduce or prevent the likelihood of damage to, or malfunction of, the display panel DP due to external impact. The impact from the outside may refer to a stimulus that may cause a defect in the display panel DP due to external force, such as a pressure or stress. The window module WM may reduce or prevent the likelihood of defects of the display panel DP by alleviating bending deformation, compression deformation, and/or tensile deformation of the display panel DP due to a point impact and a surface impact.

One or more functional layers FC may be located between the display panel DP and the window WM. For example, the functional layers FC may be an anti-reflection layer that blocks reflection of external light. The anti-reflection layer may reduce or prevent visual recognition of elements of the display panel DP at the outside due to external light incident through a front surface of the display device DD. The anti-reflection layer may include a polarizing film and/or a phase retardation film. The number of phase retardation films and a phase retardation length of the phase retardation film may be determined according to operation of the anti-reflection layer.

The functional layer FC may further include an input sensing layer for sensing the user's input TC (see FIG. 1). For example, the input sensing layer may be provided as a separate layer with respect to the display panel DP, and may be bonded through an adhesive layer. For other embodiments, the input sensing unit may be integrated with the display panel DP through at least one continuous process. That is, the input sensing unit may be directly located on a thin film encapsulation layer TFE (see FIG. 4B) of the display panel DP. Here, "directly located" may mean that the input sensing circuit is located on the display panel DP without using a separate adhesive member. FIG. 2 illustrates a configuration in which the functional layer FC is located on a top surface of the display panel DP, but the embodiments of the present disclosure are not limited thereto. In other embodiments, the functional layer FC may be located on a bottom surface of the display panel DP.

The window WM and the functional layer FC may adhere to each other through a first adhesive layer AU. The display panel DP and the functional layer FC may adhere to each other through a second adhesive layer AL2.

Each of the first adhesive layer AL1 and the second adhesive layer AL2 may be optically transparent. Each of the first adhesive layer AL1 and the second adhesive layer AL2 may be an adhesive layer prepared by applying and curing a liquid adhesive material, or may be an adhesive sheet that is prepared separately. For example, each of the first adhesive layer AL1 and the second adhesive layer AL2 may be a pressure sensitive adhesive (PSA), an optical clear adhesive (OCA), or an optical clear resin (OCR).

A protective pattern PF (see FIG. 4A) and a lower layer BC may be located under the display panel DP. The protective pattern PF (see FIG. 4A) will be described in detail later.

The lower layer BC may include at least one of a heat dissipation layer and a cushion layer. The heat dissipation layer may dissipate heat generated from the display panel DP to reduce or prevent the likelihood of damage to the display device DD due to the heat. The heat dissipation layer may include a graphite layer or the like.

The cushion layer may support the display panel DP, and may reduce or prevent the likelihood of a pressing phenomenon and/or plastic deformation in the third direction DR3. The cushion layer may include sponge, foam, or urethane.

FIG. 3 illustrates the display module DM before being assembled. Referring to FIG. 3, the display module DM may include a flexible circuit board FCB connected to the display panel DP, and a driving chip DIC mounted on the flexible circuit board FCB. The flexible circuit board FCB may be connected to a main circuit board MCB. Components such as a control chip, a plurality of passive elements, and a plurality of active elements may be mounted on the main circuit board MCB. The main circuit board MCB may be provided as a flexible film like the flexible circuit board FCB.

FIG. 3 illustrates a chip on film (COF) structure in which the driving chip DIC is mounted on the flexible circuit board FCB, but the embodiments of the present disclosure are not limited thereto. For example, the display module DM may have a chip on panel (COP) or chip on glass (COG) structure in which the driving chip DIC is mounted on the display panel DP.

Peripheral areas NBA1 and NBA2 and a bending area BA may be defined on the display panel DP. The peripheral areas NBA1 and NBA2 may include a first peripheral area NBA1 and a second peripheral area NBA2. The bending area BA may be bent at a curvature (e.g., bent to have a predetermined curvature). In some embodiments, the first and second peripheral areas NBA1 and NBA2 may be non-bending areas. However, the embodiments are not limited thereto. In other embodiments, at least a portion of the first and second peripheral areas NBA1 and NBA2 may be bent.

Figure 4A:
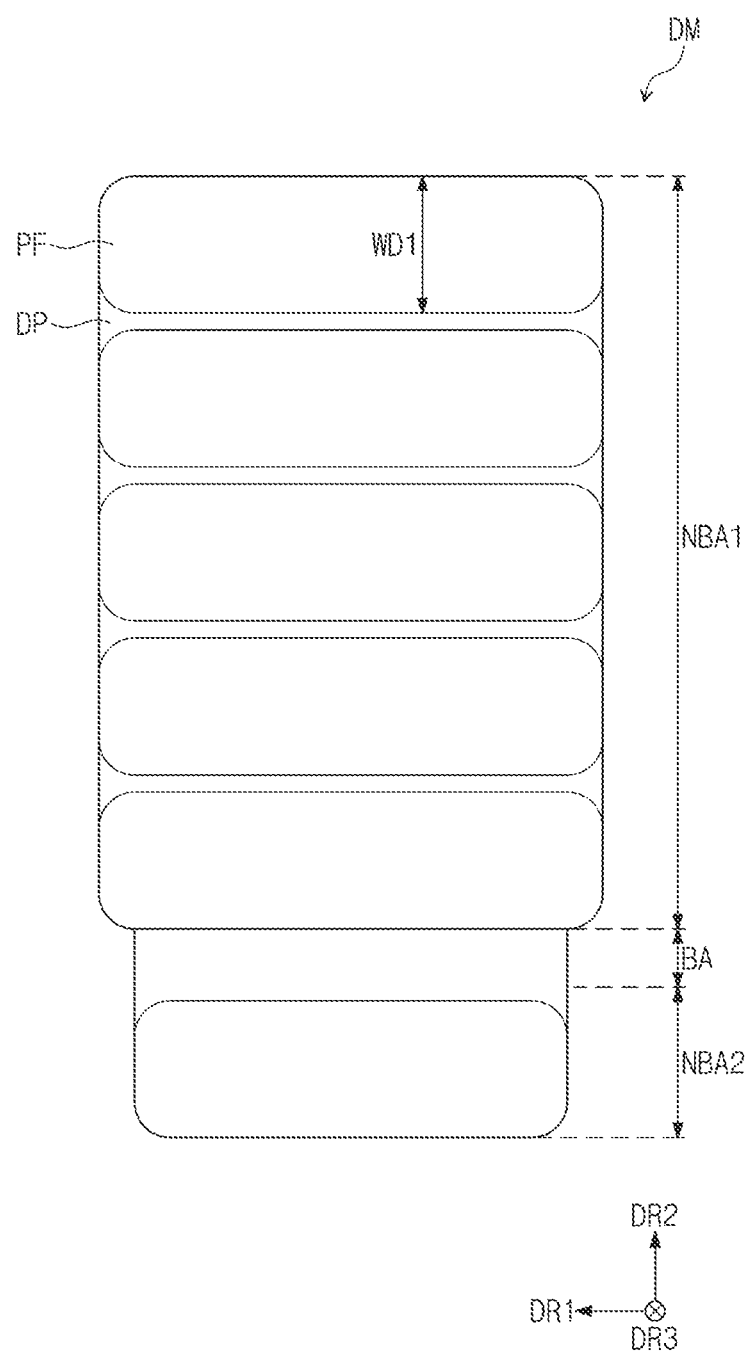
FIG. 4A is a plan view of a display module according to some embodiments of the present disclosure.

FIG. 4A is a plan view of the display module DM according to some embodiments of the present disclosure. FIG. 4A is a plan view of the display module DM of FIG. 3 when viewed from a lower side. That is, FIG. 4A illustrates a plan view of the display module DM viewed in a direction that is opposite to the third direction DR3. In the display module DM of FIG. 4A, the lower layer BC (see FIG. 2) is omitted.

In some embodiments, a rear protective pattern PF of the display panel DP may be located to overlap the first and second peripheral regions NBA1 and NBA2.

The protective pattern PF may be a layer that absorbs an impact applied to the display panel DP from the outside to protect the display panel DP. Also, the protective pattern PF may support the display panel DP. The adhesive layer PF may be directly located on the rear surface of the display panel DP without a separate adhesive layer or adhesive material. The display panel DP according to some embodiments may include a short side extending in the first direction DR1, and a long side extending in the second direction DR2.

The protective pattern PF may be provided in plural. The plurality of protective patterns PF may be spaced apart from each other in the second direction DR2. The display panel DP may be exposed between the plurality of protective patterns PF. The exposed portions of the display panel DP may extend in a direction parallel to the first direction DR1. Thus, the display module DM including the protective patterns PF according to some embodiments may be easily folded or wound in the second direction DR2.

Each of the plurality of protective patterns PF may extend in the first direction DR1 on a plane, and may have a first width WD1 in the second direction DR2.

The protective pattern PF may include a resin. Here, the protective pattern PF may include a material having sufficient flexibility to operate together when the display panel DP is folded or wound. For example, the protective pattern PF may include an acrylate-based material, polyurethane, or polyethylene, but is not limited thereto.

Figure 4B:
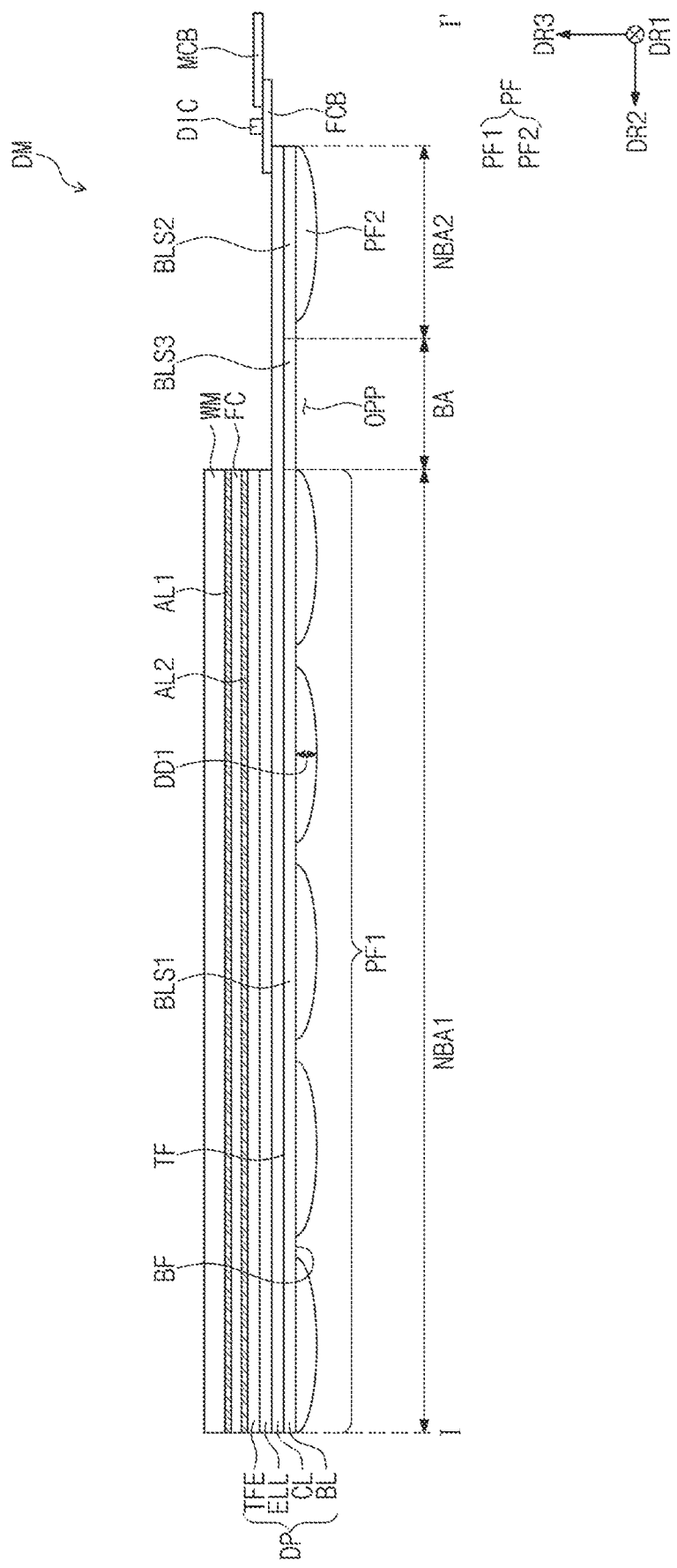
FIG. 4B is a cross-sectional view taken along the line I-I' of FIG. 3.

FIG. 4B is a cross-sectional view taken along the line I-I' of FIG. 3, and FIG. 4C is a cross-sectional view illustrating a state in which the display module of FIG. 4B is bent or folded, according to some embodiments of the present disclosure.

That is, FIG. 4B is a cross-sectional view of the display module DM of FIGS. 3 and 4A. The display module DM according to some embodiments may include a flexible display panel DP. The display panel DP may include a base layer BL, a circuit layer CL, a light emitting element layer ELL, and a thin film encapsulation layer TFE. The base layer BL may include a glass substrate and/or a synthetic resin film. For example, the base layer BL may include a polyimide film, and may have flexible characteristics. The base layer BL is not limited to a single layer. The base layer BL may include two or more films coupled to each other by an adhesive member. For example, the base layer BL includes a first synthetic resin layer, a silicon oxide ($SiO_x$) layer located on the first synthetic resin layer, an amorphous silicon (a-Si) layer located on the silicon oxide layer, and a second synthetic resin layer located on the amorphous silicon layer.

Each of the first and second synthetic resin layers may include a polyimide-based resin. Also, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyimide-based resin, or a perylene-based resin.

The base layer BL includes a first portion BLS1, a second portion BLS2, and a third portion BLS3. Like the shape of the display panel DP described with reference to FIG. 4A, the base layer BL may include a short side extending in the first direction DR1, and a long side extending in the second direction DR2. The base layer BL may include the first portion BLS1, the third portion BLS3, and the second portion BLS2 that are sequentially arranged in the second direction DR2.

The first portion BLS1 may overlap the first peripheral area NBA1 of the display panel DP. The second portion BLS2 may overlap the second peripheral area NBA2 of the display panel DP. The third portion BLS3 may overlap the bending area BA of the display panel DP.

In the display module DM according to some embodiments, the bending area BA is bent during an assembly process so that the first and second peripheral areas NBA1 and NBA2 face each other.

As illustrated in the drawings, the third portion BLS3 is located between the first portion BLS1 and the second portion BLS2. The first portion BLS1, the second portion BLS2, and the third portion BLS3 may have an integrated shape. For example, the third portion BLS3 may extend from the first portion BLS1, and the second portion BLS2 may extend from the third portion BLS3.

The circuit layer CL is located on one surface TF of the base layer BL, and the protective pattern PF is located on the other surface BF of the base layer BL. In this specification, one surface TF of the base layer BL may be a surface facing the third direction DR3 (e.g., a front surface of the base layer BL). In FIG. 4B, the circuit layer CL may be described as being located on the same one surface TF of the base layer BL.

The other surface BF of the base layer BL may be a surface facing a direction that is opposite to the third direction DR3 (e.g., a rear surface of the base layer BL). In FIG. 4B, the protective pattern PF may be described as being located on this other surface BF of the base layer BL.

The protective pattern PF is provided in plural to be spaced apart from each other on the other surface BF of the base layer BL. In some embodiments, the protective pattern PF may be in contact with the other surface BF of the base layer BL.

Each of the plurality of protective patterns PF may have a bow shape (e.g., a semi-circle or an arch shape) when viewed in cross-section, according to some embodiments. Each of the protective patterns PF may have a thickness DD1 of about 10 μm to about 100 μm. The thickness may be a value measured in the third direction DR3.

Each of the plurality of protective patterns PF may gradually decrease in thickness from a center toward each end thereof. Thus, when a portion of the display panel DP is folded, collision between the adjacent protective patterns PF may be reduced or minimized to reduce damage of the display module DM.

The plurality of protective patterns PF includes one or more first protective patterns PF1 spaced apart from each other on the other surface of the first portion BLS1, and one or more second protective patterns PF2 spaced apart from each other on the other surface of the second portion BLS2. The first protective patterns PF1 may be in contact with the other surface of the first portion BLS1. The second protective patterns PF2 may be in contact with the other surface of the second portion BLS2. The other surface of the first portion BLS1 and the other surface of the second portion BLS2 may be the same as, or may correspond to, the other surface BF of the base layer BL.

A bending opening part OPP on which the protective pattern PF is not located may be defined on the other surface BF of the base layer BL. For example, a bending open part OPP may be defined on the other surface of the third portion BLS3. Because the protective pattern PF is not located on the third portion BLS3, stress generated in the bending area BA during the bending may be reduced.

The circuit layer CL may be located on the aforementioned one surface of the base layer BL. The circuit layer CL may overlap the first to third portions BLS1, BLS2, and BLS3. The circuit layer CL may include signal lines and transistors for driving the light emitting element.

The light emitting element layer ELL may be located on one surface of the circuit layer CL. The light emitting element layer ELL layer may be located on one surface of the first portion BLS1. In some embodiments, the light emitting element layer ELL may not overlap the second portion BLS2 and the third portion BLS3. The light emitting element layer ELL may include the light emitting element to generate the image IM (see FIG. 1). For example, the light emitting element layer ELL may include an organic light emitting element.

The thin film encapsulation layer TFE may seal the light emitting element layer ELL to protect the light emitting element layer ELL against external oxygen or moisture.

Figure 5A:
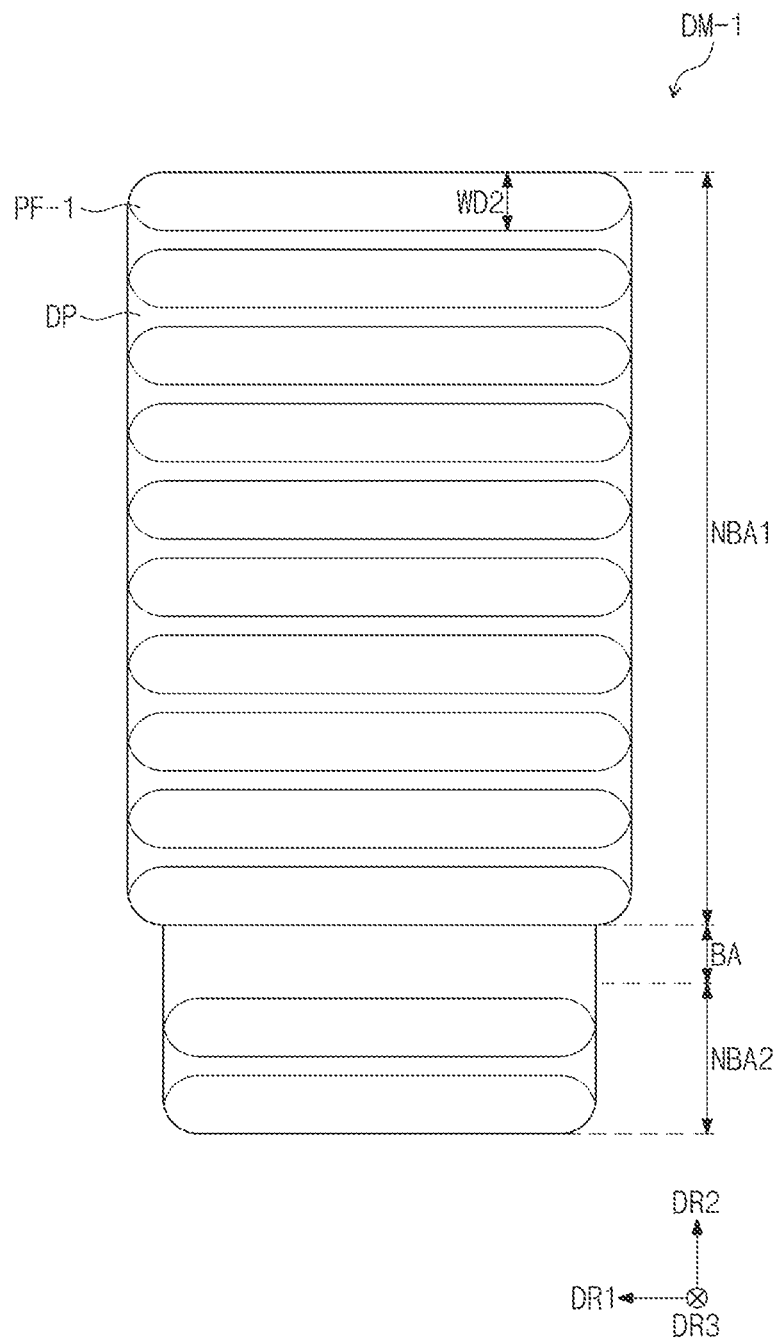
FIG. 5A is a plan view of the display panel according to some embodiments of the present disclosure.

FIG. 5A is a cross-sectional view of a display module DM-1 according to some embodiments of the present disclosure, and FIG. 5B is a cross-sectional view taken along the line I-I' of FIG. 3. A repeated description of the above-described elements among those illustrated in FIGS. 5A and 5B will be omitted.

Referring to FIGS. 5A and 5B, the display module DM-1 according to some embodiments may include a display panel DP, and a protective pattern PF-1 located on a rear surface of the display panel DP. The rear surface of the display panel DP may be the other surface BF of the base layer BL (e.g., see FIGS. 4B and 4C).

The protective pattern PF-1 may be provided in plural, and the plurality of protective patterns PF-1 may be spaced apart from each other in the second direction DR2.

Each of the plurality of protective patterns PF-1 may extend in a first direction DR1 on the plane, and may have a second width WD2 in the second direction DR2. The second width WD2 may be less than the first width WD1 (see FIG. 4A). As the width of the plurality of protective patterns PF-1 decreases compared to the plurality of protective patterns PF illustrated in FIG. 4A, the number of protective patterns located on the same area may increase. Thus, the display module DM-1 according to some embodiments may improve the flexible characteristics of the display module DM-1.

The protective pattern PF-1 according to some embodiments includes a first protective pattern PF1-1 located on the other surface of the first portion BLS1, and a second protective pattern PF2—located on the other surface of the second portion BLS2.

Figure 6A:
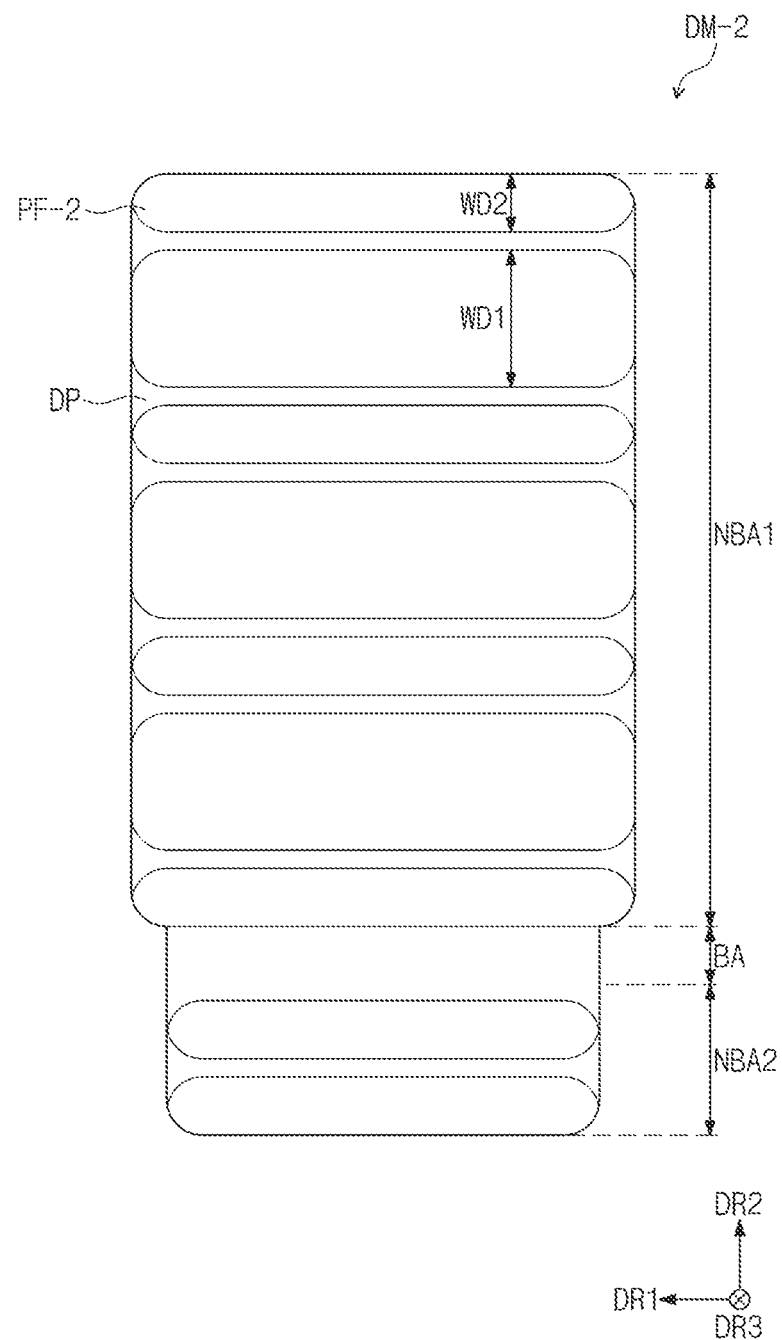
FIG. 6A is a plan view of the display module according to some embodiments of the present disclosure.

FIG. 6A is a plan view of a display module DM-2 according to some embodiments of the present disclosure, and FIG. 6B is a cross-sectional view taken along the line I-I' of FIG. 3. A repeated description of the same elements illustrated in FIGS. 4A to 4C among those illustrated in FIGS. 6A and 6B will be omitted.

Referring to FIGS. 6A and 6B, the display module DM-2 according to some embodiments may include a display panel DP, and a protective pattern PF-2 located on a rear surface of the display panel DP. The rear surface of the display panel DP may be the other surface BF (e.g., see FIGS. 4B and 4C) of the base layer BL.

The protective pattern PF-2 may be provided as a plurality, and the plurality of protective patterns PF-2 may be spaced apart from each other in the second direction DR2.

Each of the plurality of protective patterns PF-2 may extend in the first direction DR1 on the plane. In some embodiments, a width of at least one of the plurality of protective patterns PF-2 may be different from a width of another one of the protective patterns PF-2. For example, one of the plurality of protective patterns PF-2 may have a first width WD1, and another may have a second width WD2. Each of the first width WD1 and the second width WD2 may be a length measured in the second direction DR2.

The protective pattern PF-2 according to some embodiments includes a first protective pattern PF1-2 located on the other surface BF of the first portion BLS1, and a second protective pattern PF2-2 located on the other surface BF of the second portion BLS2.

According to a folding area of the product to which the protective pattern PF-2 is to be applied, the widths of the plurality of protective patterns PF-2 may be variously adjusted in consideration of a folded portion of the display module DM-2.

For example, the first protective patterns PF1-2 may have various widths, and the second protective patterns PF2-2 may have a constant width.

The shape of each of the protective pattern PF-2 and the display module DM-2 are not limited to the above-described embodiments.

Figure 7A:
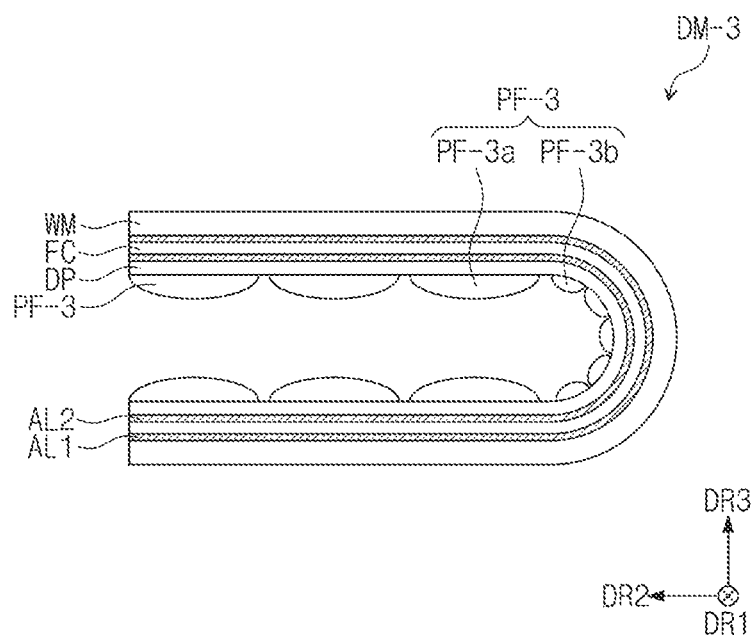
FIGS. 7A and 7B are plan views of the display module according to some embodiments of the present disclosure.
Figure 7B:
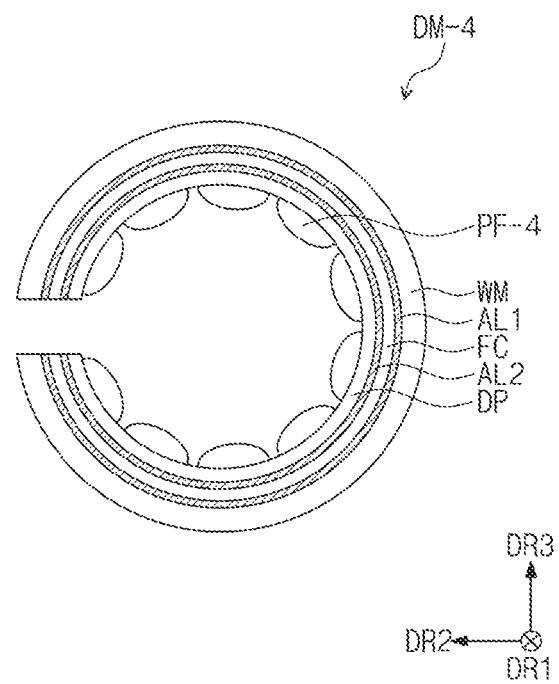

FIGS. 7A and 7B are plan view of display modules DM-3 and DM-4 according to some embodiments. A repeated description of the above-described elements among the elements illustrated in FIGS. 7A and 7B will be omitted.

Referring to FIG. 7A, the display module DM-3 according to some embodiments may be folded in one direction. A protective pattern PF-3 according to some embodiments may be located on an entirety of the other surface BF (e.g., see FIGS. 4A and 4B) of the display panel DP, and may be provided in plural. In the protective pattern PF-3 according to some embodiments, a size of the protective pattern PF-3b located at a foldable portion of the display panel DP may be adjusted to be less than that of a protective pattern PF-3a located at a non-foldable portion of the display panel DP. Thus, a portion of the display panel DP may be easily folded.

Referring to FIG. 7B, the display module DM-4 according to some embodiments may be wound in a circular shape. The protective pattern PF-4 according to some embodiments may be located on an entirety of the other surface BF of the display panel DP.

Figure 8A:
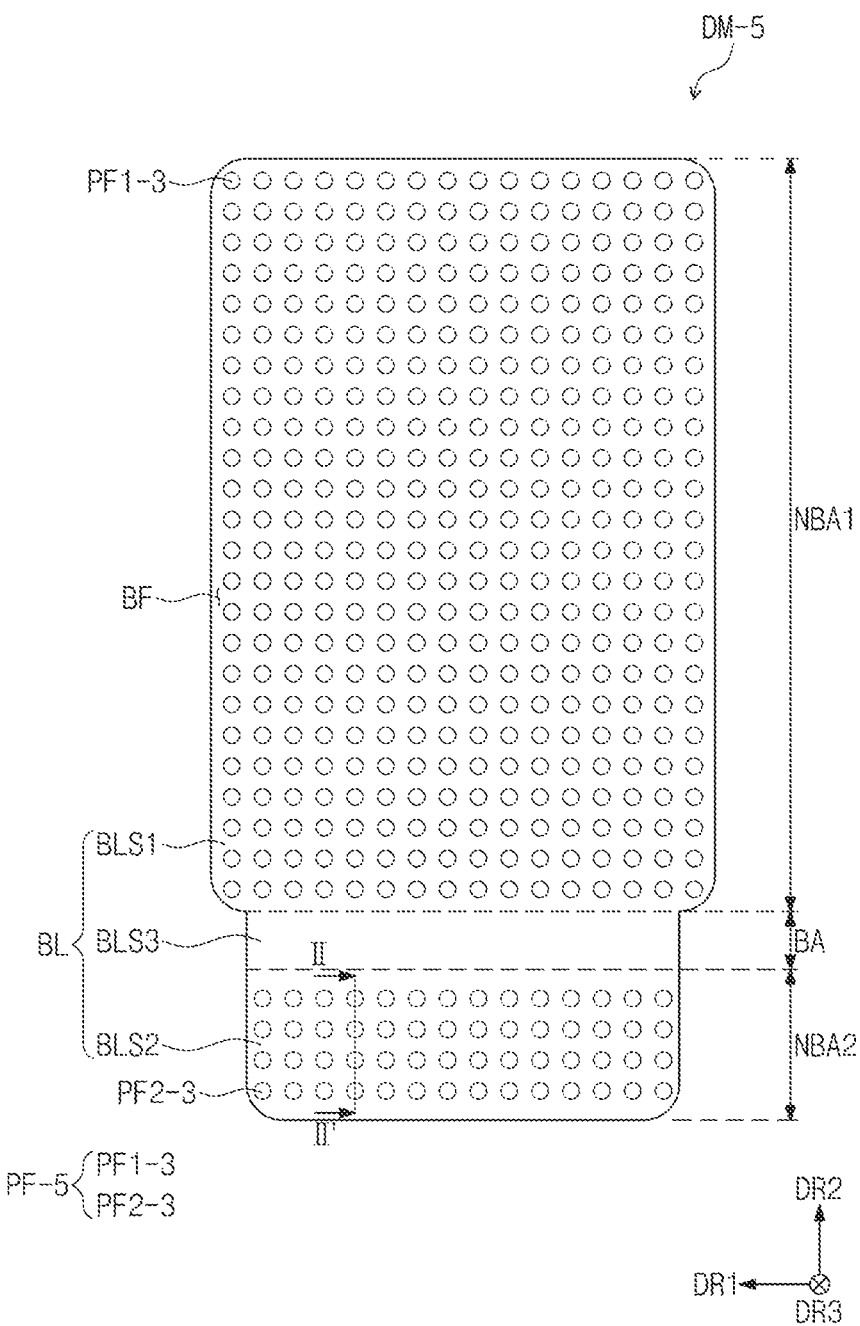
FIG. 8A is a plan view of the display module according to some embodiments of the present disclosure.
Figure 8B:
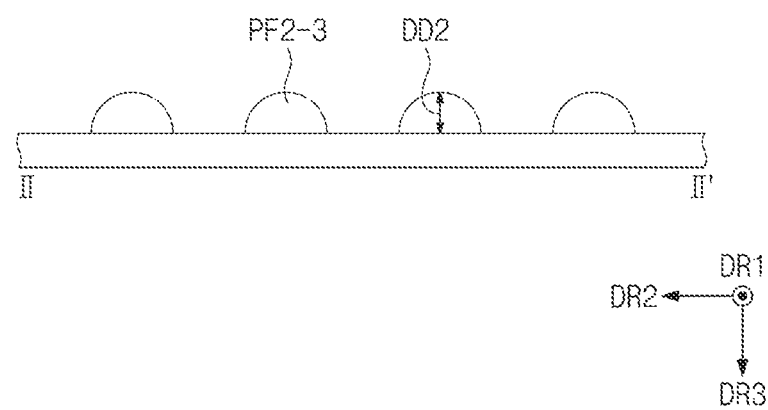
FIG. 8B is a cross-sectional view taken along the line II-II' of FIG. 8A.

FIG. 8A is a plan view of a display module DM-5 according to some embodiments of the present disclosure, FIG. 8B is a cross-sectional view taken along the line II-II' of FIG. 8A, and FIGS. 9 to 15 are respectively plan views of display modules DM-6, DM-7, DM-8, DM-9, DM-10, DM-11, and DM-12 according to some embodiments.

Referring to FIG. 8A, the display module DM-5 according to some embodiments may include a protective pattern PF-5 located on the other surface BF of the base layer BL. In some embodiments, the protective pattern PF-5 may be in contact with the other surface BF of the base layer BL.

The protective pattern PF-5 is provided in plural to be spaced apart from each other on the other surface BF of the base layer BL. The other surface BF of the base layer BL may be exposed between the plurality of protective patterns PF-5.

Each of the plurality of protective patterns PF-5 according to some embodiments may have a circular shape on the plane. For example, the plurality of protective patterns PF-5 may be arranged to be spaced apart from each other in a row parallel to the first direction DR1, and in a column parallel to the second direction DR2. The display module DM-5 including the plurality of protective patterns PF-5 according to some embodiments may be easily folded or wound in a direction parallel to the first direction DR1 or the second direction DR2. When the display module DM-5 is folded or wound, as the protective patterns PF-5 are spaced apart from each other in a circular shape, collision between the adjacent protective patterns PF-5 may be reduced or minimized.

The plurality of protective patterns PF-5 includes a plurality of first protective patterns PF1-3 located on other surface BF of the first portion BLS1, and a plurality of second protective patterns PF2-3 located on the other surface BF of the second portion BLS2.

A separate protective pattern may be omitted from the third portion BLS3 in some embodiments. Because the third portion BLS3 does not include the protective pattern, a thinness may be realized, and when the bending area BA is bent, stress generated in the base layer BL may be reduced.

Referring to FIG. 8B, the protective pattern PF-5 according to some embodiments may have a bow shape (e.g., a semi-circle or an arch shape) in a cross-section. Also, the protective pattern PF-5 may have a thickness DD2 of about 10 μm or less.

Figure 9:
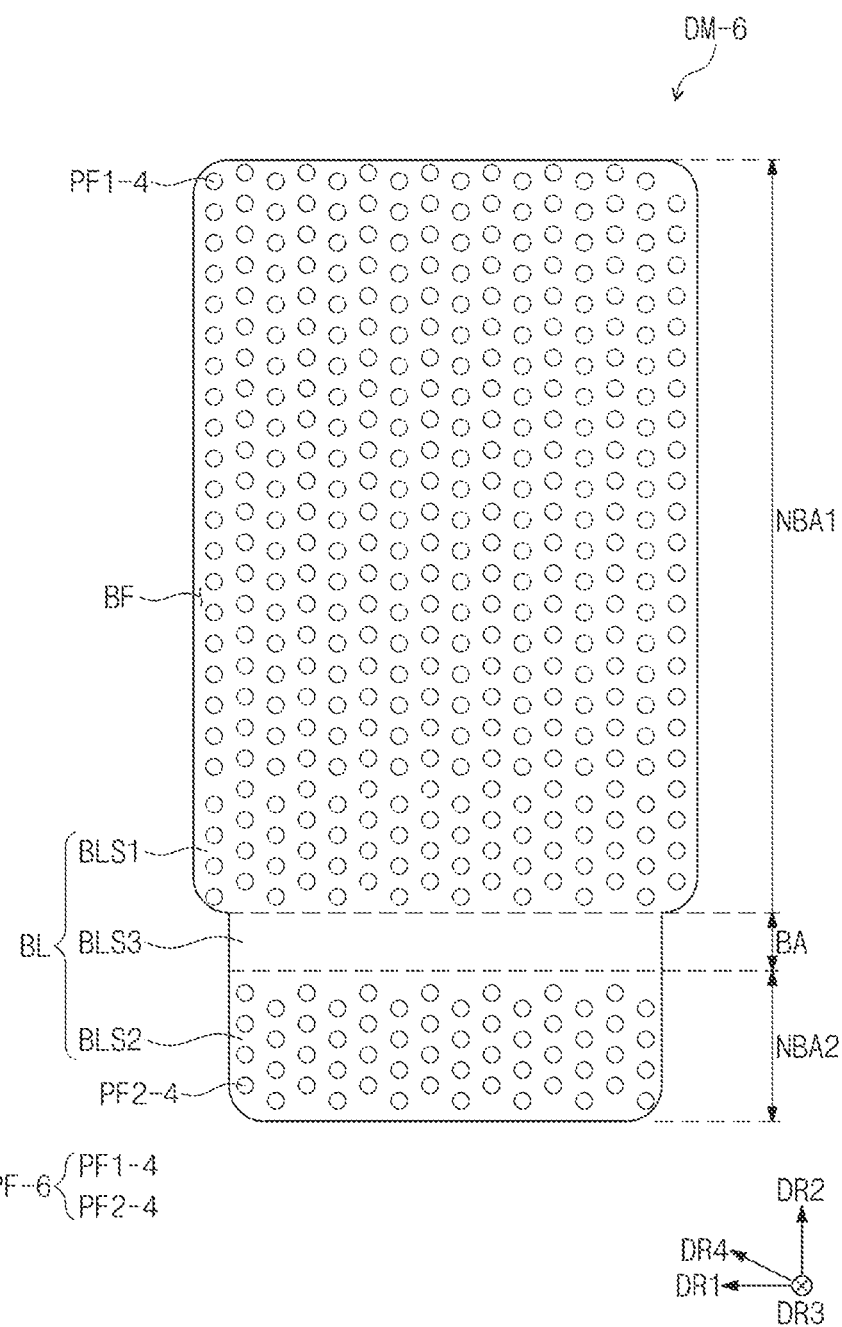
FIGS. 9 and 10 to 15 are plan views of the display module according to some embodiments of the present disclosure.

Referring to FIG. 9, the display module DM-6 according to some embodiments may include a protective pattern PF-6 located on the other surface BF of the base layer BL.

Each of the plurality of protective patterns PF-6 according to some embodiments may have a circular shape on the plane/in a plan view. For example, the plurality of protective patterns PF-6 may be arranged in a diagonal direction between the first direction DR1 and the second direction DR2, and in a column parallel to the second direction DR2. For example, the plurality of protective patterns PF-6 may be arranged to be parallel to a fourth direction DR4, which is a direction between the first direction DR1 and the second direction DR2. The plurality of protective patterns PF-6 may be arranged in a column parallel to the second direction DR2. The display module DM-6 according to some embodiments may be easily folded or wound with respect to the fourth direction DR4 or the second direction DR2. When the display module DM-6 is folded or wound, as the protective patterns PF-6 are spaced apart from each other in a circular shape, collision between the adjacent protective patterns PF-6 may be reduced or minimized.

The plurality of protective patterns PF-6 includes a plurality of first protective patterns PF1-4 located on other surface BF of the first portion BLS1, and a plurality of second protective patterns PF2-4 located on the other surface BF of the second portion BLS2. A separate protective pattern may be omitted from the third portion BLS3. However, the embodiments are not limited thereto, and a protective pattern may be located on the third portion BLS3 in other embodiments.

Figure 10:
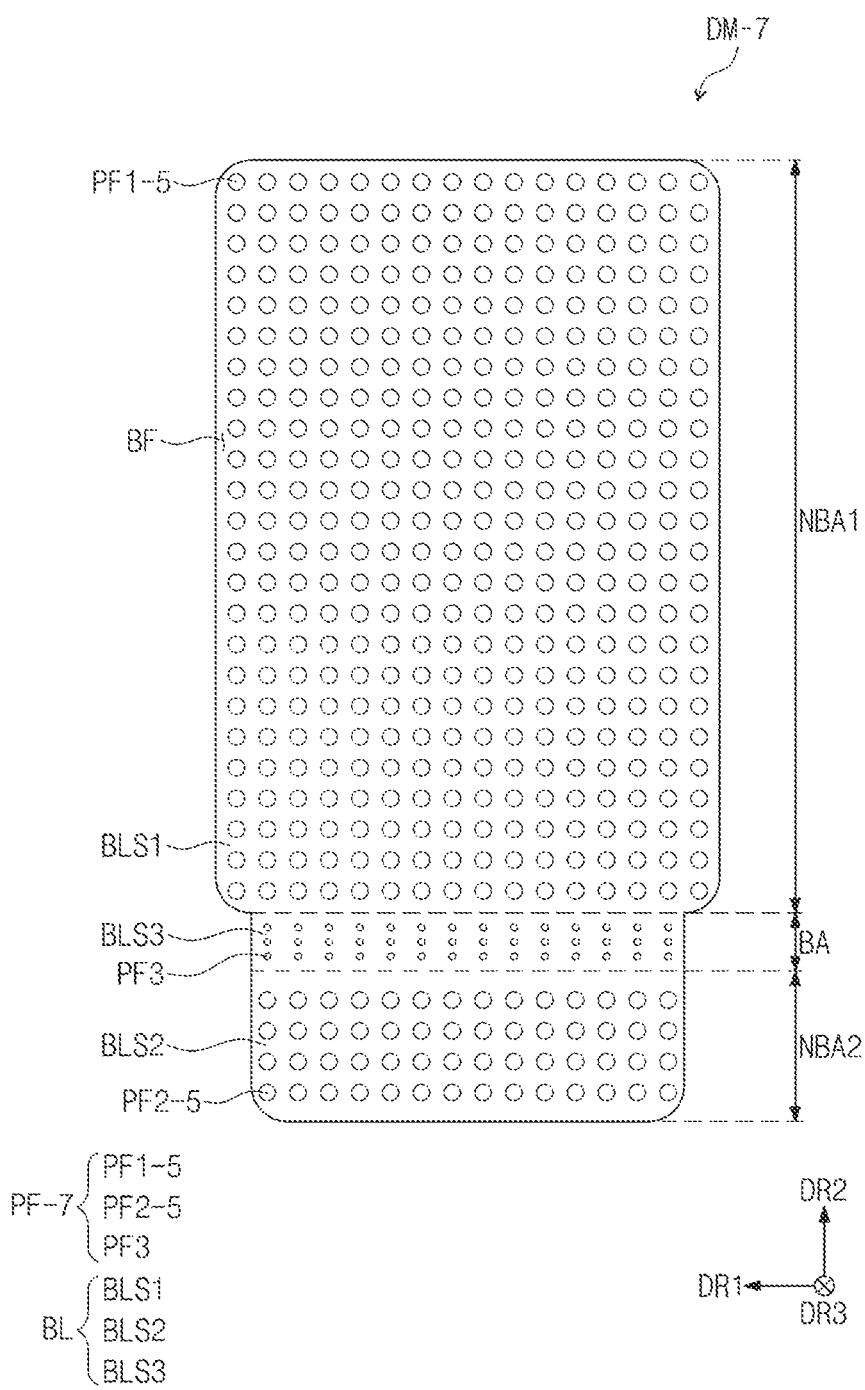

For example, referring to FIG. 10, the display module DM-7 according to some embodiments may include a protective pattern PF-7 located on the other surface BF of the base layer BL. The protective patterns PF-7 may be provided in plural, and may be in contact with the other surface BF of the base layer BL. Alternatively, the plurality of protective patterns PF-7 according to some embodiments may have a circular shape, and may be arranged to be spaced apart from each other in the first direction DR1 and in the second direction DR2 in a manner similar to the protective pattern PF-5 described above in FIG. 8.

The plurality of protective patterns PF-7 may include a plurality of first protective patterns PF1-5 located on the other surface BF of the first portion BLS1, a plurality of second protective patterns PF2-5 located on the other surface BF of the second portion BLS2, and a third protective pattern PF3 located on the other surface BF of the third portion BLS3. As the third protective patterns PF3 are located on the other surface BF of the third portion BLS3, force supporting, or support of, the third portion BLS3 may be improved.

Because the third portion BLS3 overlaps the bending area BA, the flexible characteristics may be suitable as compared to the first portion BLS1 and the second portion BLS2. To reduce or minimize the stress generated when the third portion BLS3 is bent, sizes of each of the third protective patterns PF3 may be adjusted to be less than that of each of the first and second protective patterns PF1-5.

A density per unit area of the plurality of third protective patterns PF3 may be less than a density per unit area of the plurality of first protective patterns PF1-5. The density per unit area of the first protective pattern PF1-5 may be substantially the same as the density per unit area of the second protective pattern PF2-5.

As the density per unit area of the third protective pattern PF3 may be adjusted to be less than the density per unit area of each of the first and second protective patterns PF1-5 and PF2-5, and the third portion BLS3 may be flexible. That is, the density per unit area of the protective pattern PF-3 located on the bending area BA may be adjusted to be less than the density per unit area of the protective patterns PF1-5 and PF2-5 located on the peripheral areas NBA1 and NBA2 to facilitate an operation of the bending area BA.

The display module DM-7 includes the protective patterns PF-7 according to some embodiments to maintain the flexible characteristic of the third portion BLS3, and to also improve the force for supporting the third portion BLS3.

To improve the force supporting the base layer BL as well as the third portion BLS3, the display modules DM-8, DM-9, DM-10, DM-11, and DM-12 illustrated in FIGS. 11 to 15 may further include additional protective patterns PFL, PFL-1, PFL-2, PFL-3, and PFL-4 on at least a portion of the base layer BL.

Figure 11:
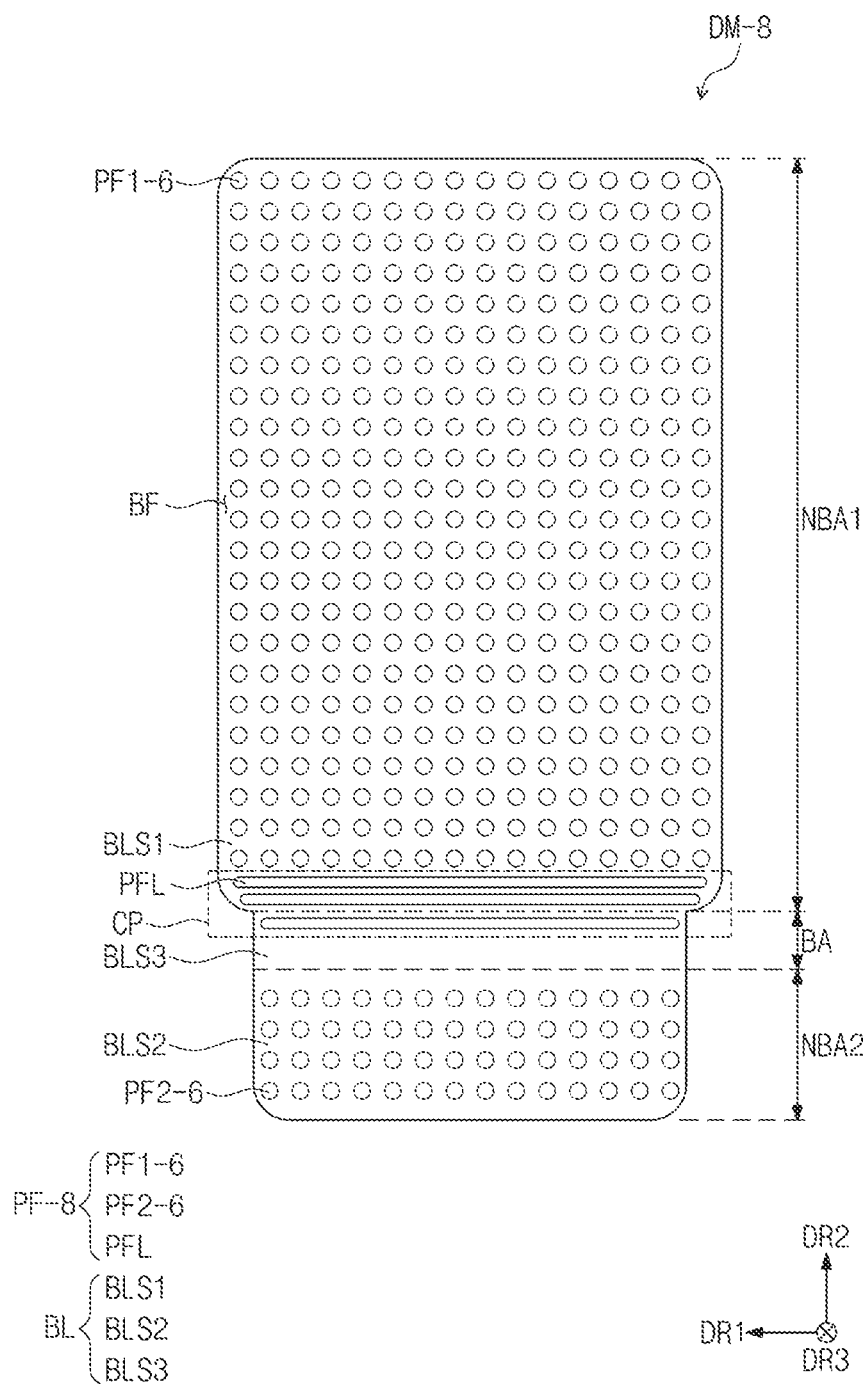

For example, referring to FIG. 11, the display module DM-8 according to some embodiments may include a protective pattern PF-8 located on the other surface BF of the base layer BL. The protective pattern PF-8 according to some embodiments may be provided in plural, and at least a portion of the plurality of protective patterns PF-8 may be located to be adjacent to a boundary between the first portion BLS1 and the third portion BLS3.

For example, the plurality of protective patterns PF-8 may include a plurality of first protective patterns PF1-6 located on the other surface BF of the first portion BLS1, a plurality of second protective patterns PF2-6 located on the other surface BF of the second portion BLS2, and connection protection patterns PFL located on a connection part CP.

The connection part CP may be defined at a part of the first portion BLS1 adjacent to the third portion BLS3 and/or at a part of the third portion BLS3 adjacent to the first portion BLS1.

The connection protection patterns PFL may be located on the first portion BLS1 adjacent to the third portion BLS3 and on the third portion BLS3 adjacent to the first portion BLS1.

The connection part CP may be a portion at which the width of the base layer BL is reduced. For example, the connection part CP may be a portion at which the width of the base layer BL decreases while the third portion BLS3 extends from the first portion BLS1.

The signal line provided in the circuit layer CL (see FIG. 4B) may overlap the front surface of the base layer BL to connect the light emitting element of the light emitting element layer ELL (see FIG. 4B) to the flexible circuit board FCB. That is, the signal line provided in the circuit layer CL may overlap the first to third portions BLS1, BLS2, and BLS3, and as the width of the base layer BL decreases in the connection part CP, the signal lines of the circuit layer CL may be concentrated on one surface of the connection part CP. Thus, the connection protection pattern PFL may be located on the other surface BF of the connection part CP to improve the force supporting the connection part CP.

The connection protection patterns PFL according to some embodiments may be located to be spaced apart from each other on the other surface BF of the connection part CP. The connection protection patterns PFL may be spaced apart from each other in the second direction DR2, and each of the connection protection patterns PFL may have a shape extending in the first direction DR1. However, the shape of the connection protection patterns PFL is not limited thereto.

Figure 12:
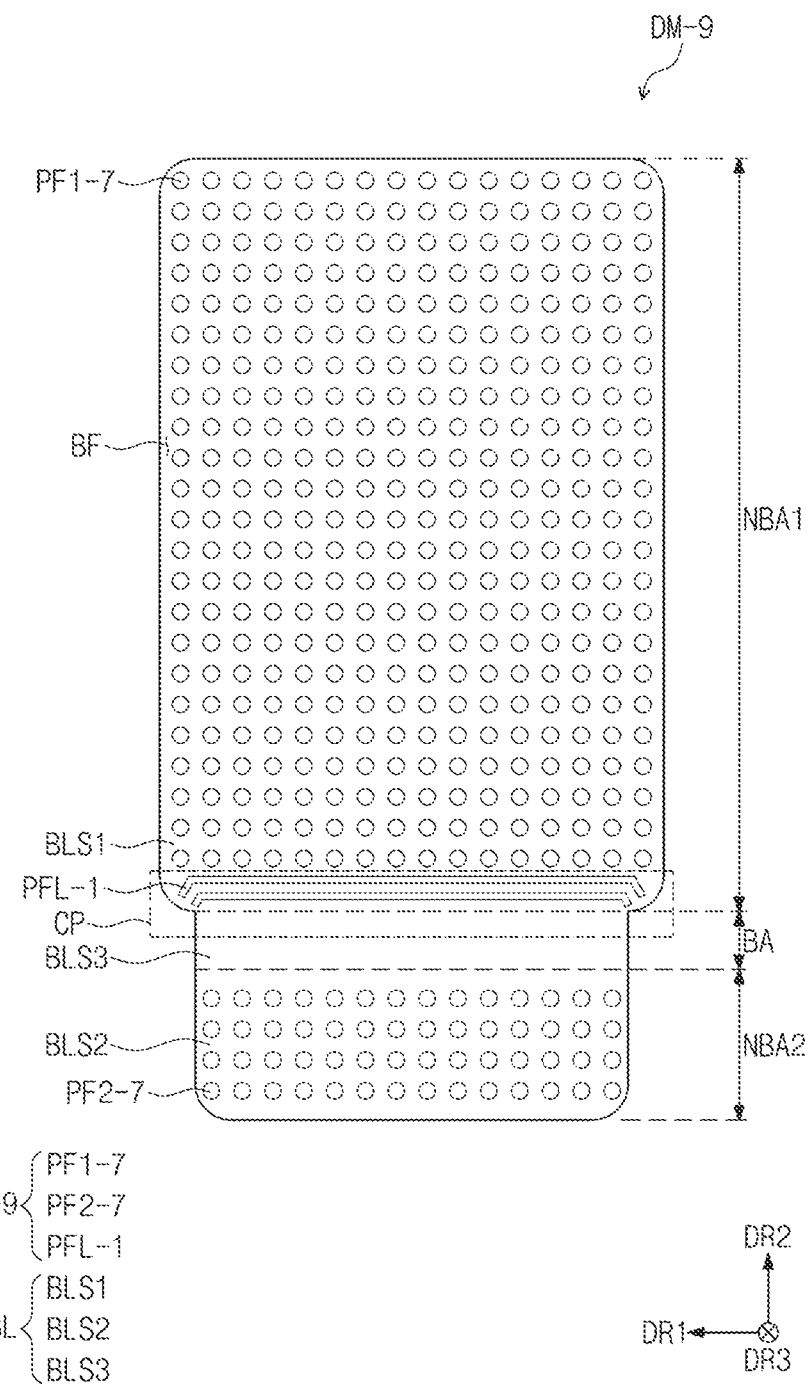

For example, the display module DM-9 illustrated in FIG. 12 may include a protective pattern PF-9 located on the other surface BF of the base layer BL. The protective pattern PF-9 according to some embodiments may be provided as a plurality, and may include first protective patterns PF1-7, a plurality of second protective patterns PF2-7 located on the other surface BF of the second portion BLS2, and connection protection patterns PFL-1.

Each of the connection protection patterns PFL-1 according to some embodiments may have a shape that is bent at both ends of the connection part CP as illustrated in the drawing.

Figure 13:
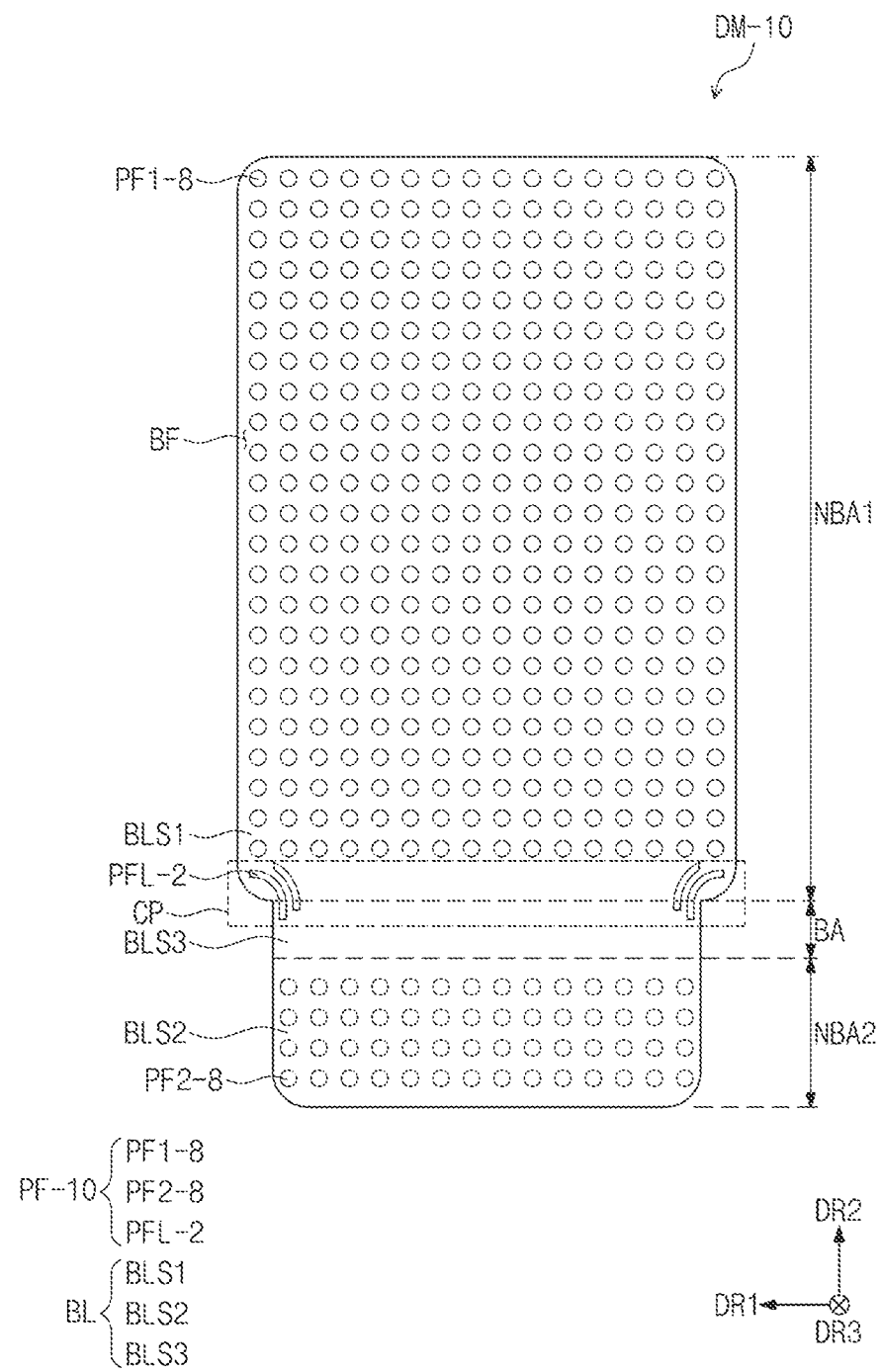

For example, the display module DM-10 illustrated in FIG. 13 may include a protective pattern PF-10 located on the other surface BF of the base layer BL. The protective pattern PF-10 according to some embodiments may be provided as a plurality, and may include first protective patterns PF1-8, a plurality of second protective patterns PF2-8 located on the other surface BF of the second portion BLS2, and connection protection patterns PFL-2.

The connection protection patterns PFL-2 according to some embodiments may be located only at the ends of the connection part CP, and may have a shape surrounding or partially surrounding ends of the connection part CP.

Figure 14:
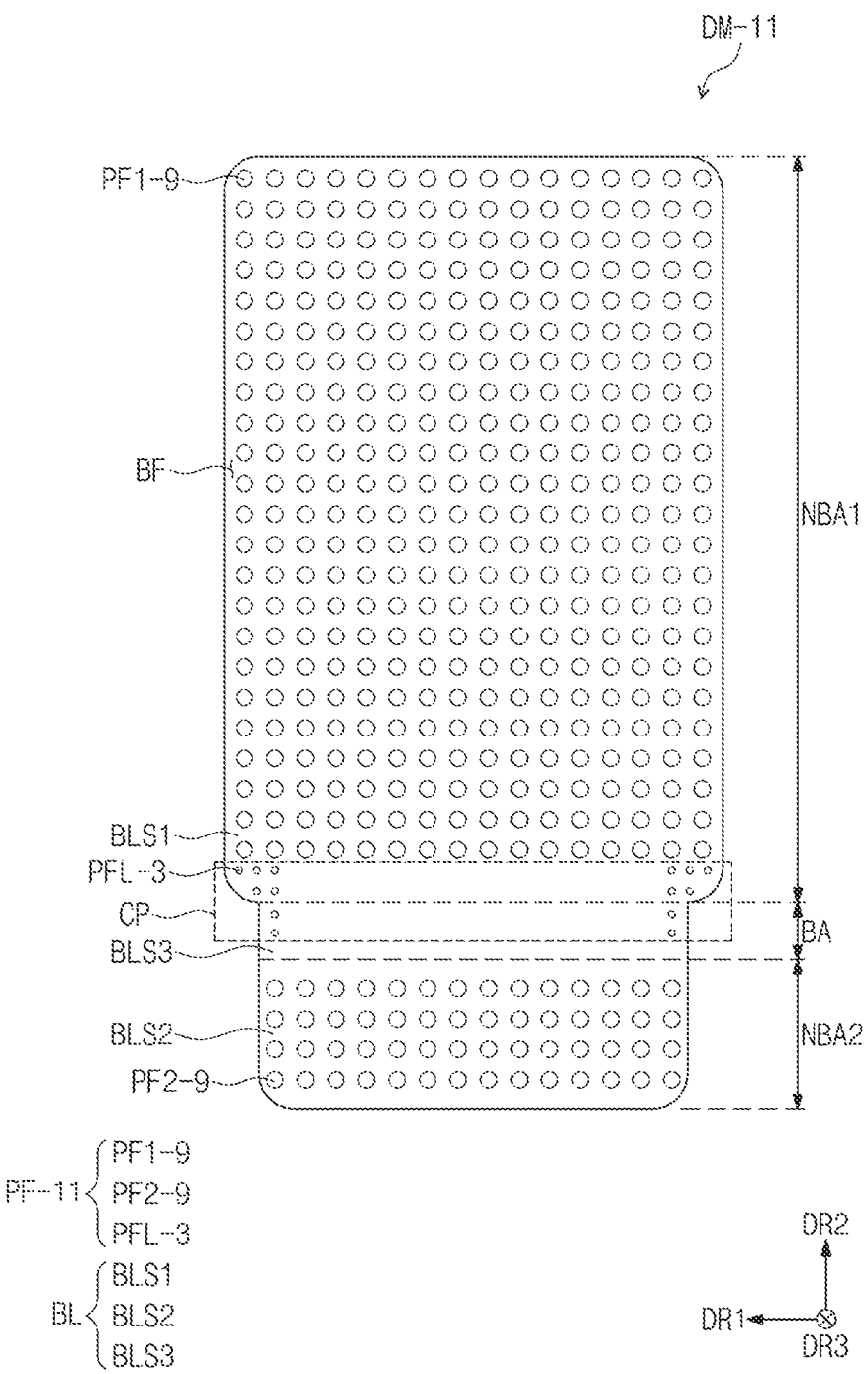

For example, the display module DM-11 illustrated in FIG. 14 may include a protective pattern PF-11 located on the other surface BF of the base layer BL. The protective pattern PF-11 according to some embodiments may be provided as a plurality, and may include first protective patterns PF1-9, a plurality of second protective patterns PF2-9 located on the other surface BF of the second portion BLS2, and connection protection patterns PFL-3.

Each of the connection protection patterns PFL-3 according to some embodiments may be located only at ends of the connection part CP, and may have a circular shape.

Figure 15:
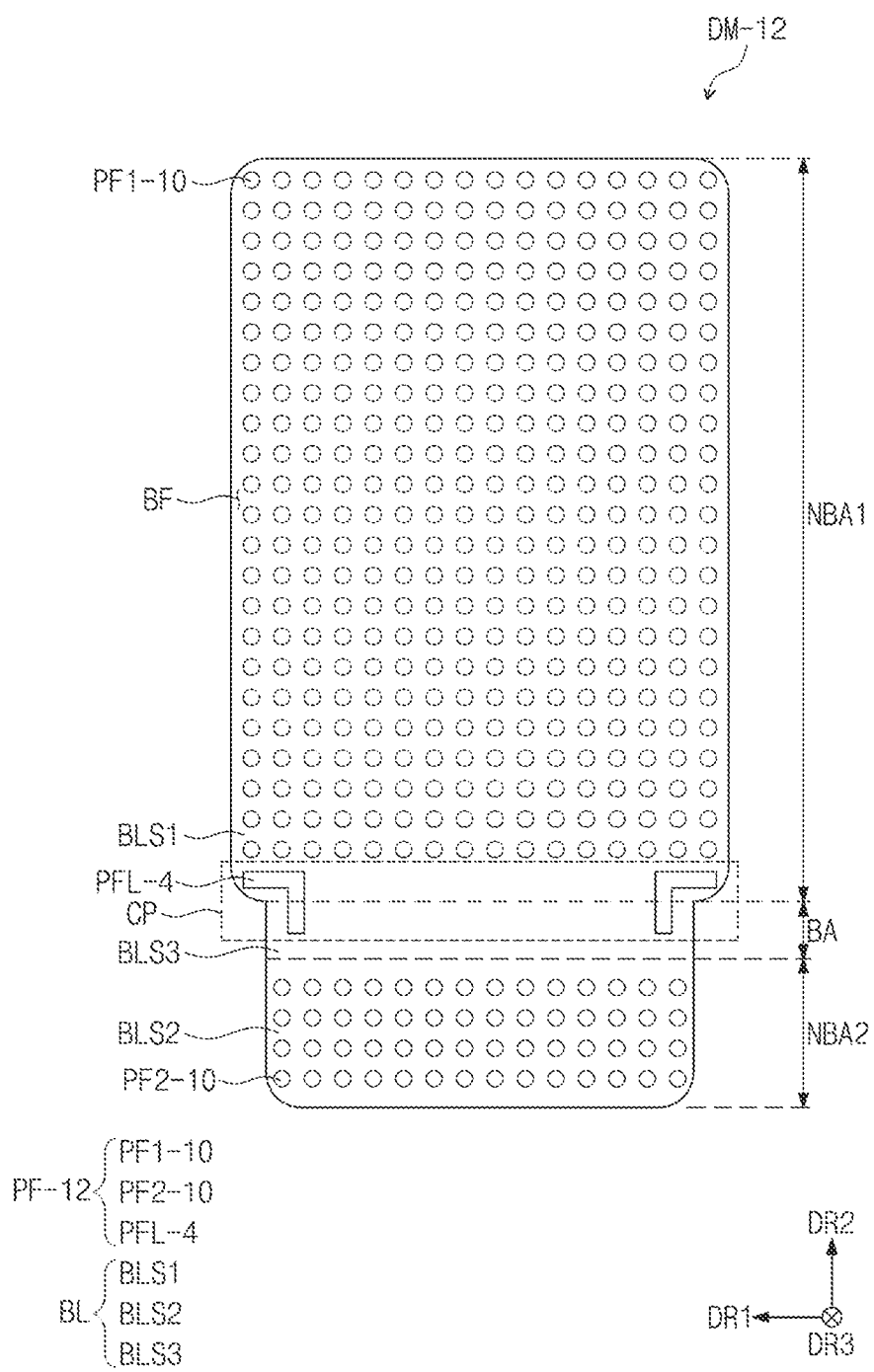

For example, the display module DM-12 illustrated in FIG. 15 may include a protective pattern PF-12 located on the other surface BF of the base layer BL. The protective pattern PF-12 according to some embodiments may be provided as a plurality, and may include first protective patterns PF1-10, a plurality of second protective patterns PF2-10 located on the other surface BF of the second portion BLS2, and connection protection patterns PFL-4.

The connection protection patterns PFL-4 according to some embodiments may be located at only both ends of the connection part CP as illustrated in the drawing and may have a shape that is bent at both ends of the connection part CP.

In FIGS. 11 to 15, the first and second protective patterns PF1-6 to PF1-10 and PF2-6 to PF2-10 are illustrated in a circular shape as an example, but the embodiments are not limited thereto and may have the shape as in FIGS. 4A, 5A, and 6A.

In addition, the same description may be applied to the configurations described in FIGS. 1 to 10 among the configurations illustrated in FIGS. 11 to 15.

The display device DD according to some embodiments of the present disclosure may include the above-described protective patterns PF to PF-12 on the other surface BF of the base layer BL to improve the force supporting the base layer BL and the flexible characteristics. For example, the protective patterns PF to PF-12 are applied to the flexible display device to reduce or minimize stress generated in the lower protective layer of the base layer according to the related art when a portion of the base layer BL is folded or wound and improve the flexible characteristics.

Figure 16:
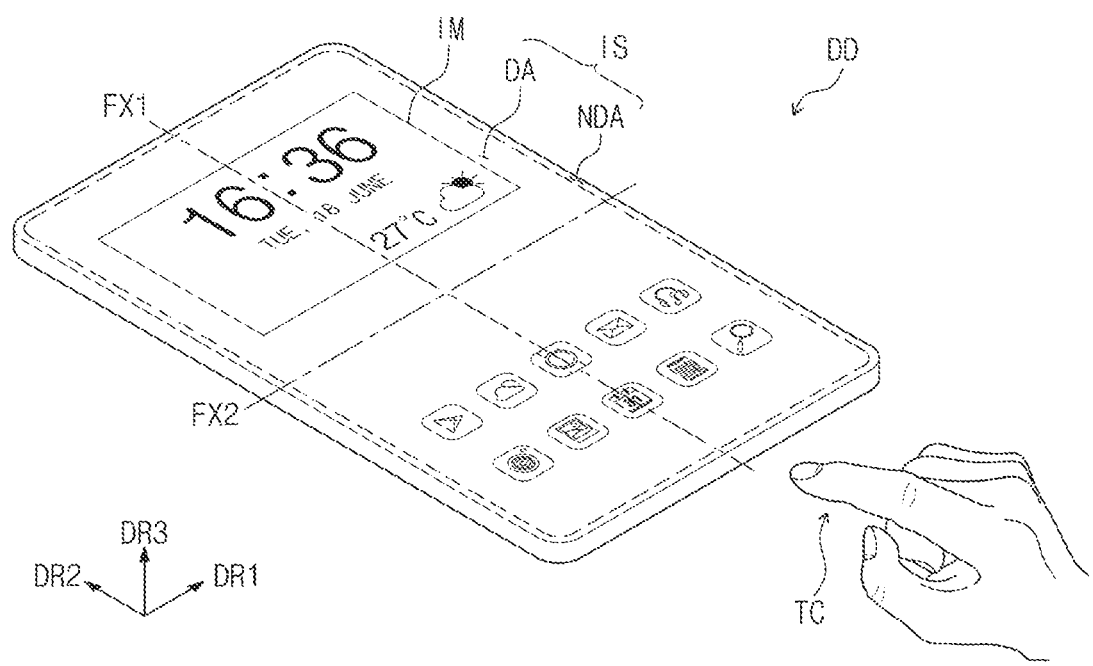
FIG. 16 is a coupling perspective view of a display device according to some embodiments of the present disclosure.

FIG. 16 is a coupling perspective view of the display device DD according to some embodiments of the present disclosure, and FIGS. 17A, 17B, 18A, 18B, 19A, 19B, and 19C are views illustrating a state in which the display device DD of FIG. 16 is folded.

The display device DD of FIGS. 16 to 19C may include the protective patterns PF to PF-12 described above.

Referring to FIG. 16, the display device DD according to some embodiments may be folded with respect to folding axes FX1 and FX2 extending in respective directions (e.g., each extending in a predetermined direction). Hereinafter, the state folded with respect to the folding axes FX1 and FX2 may be defined as a folded state, and an unfolded state is defined as a non-folded state.

The folding axes FX1 and FX2 may extend in the first direction DR1 or the second direction DR2 (e.g., respectively). In some embodiments of the present disclosure, the folding axis extending in the second direction DR2 is defined as a first folding axis FX1, and a folding axis extending in the first direction DR1 is defined as a second folding axis FX2. That is, the display device DD may be folded with respect to one of the first folding axis FX1 and/or the second folding axis FX2.

Figure 17A:
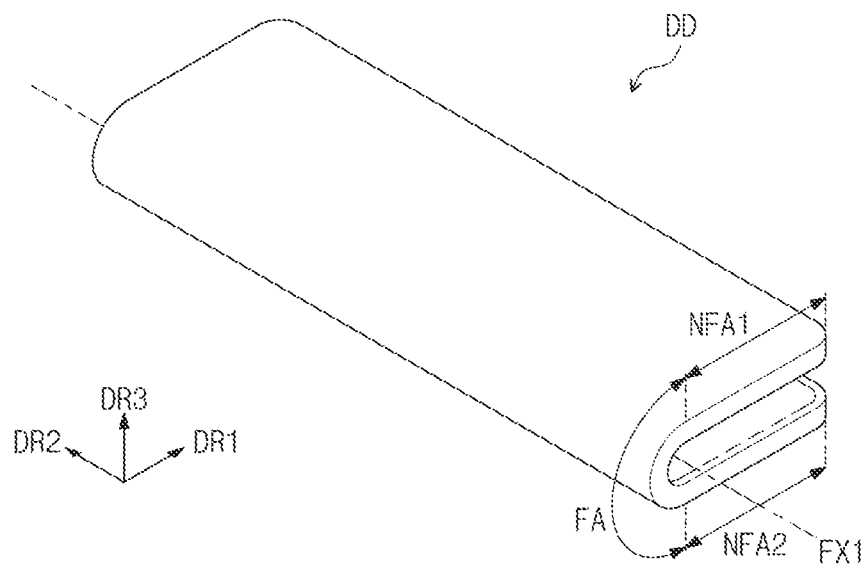
FIGS. 17A, 17B, 18A, 18B, 19A, 19B, and 19C are views illustrating a state in which the display device of FIG. 6 is folded.
Figure 17B:
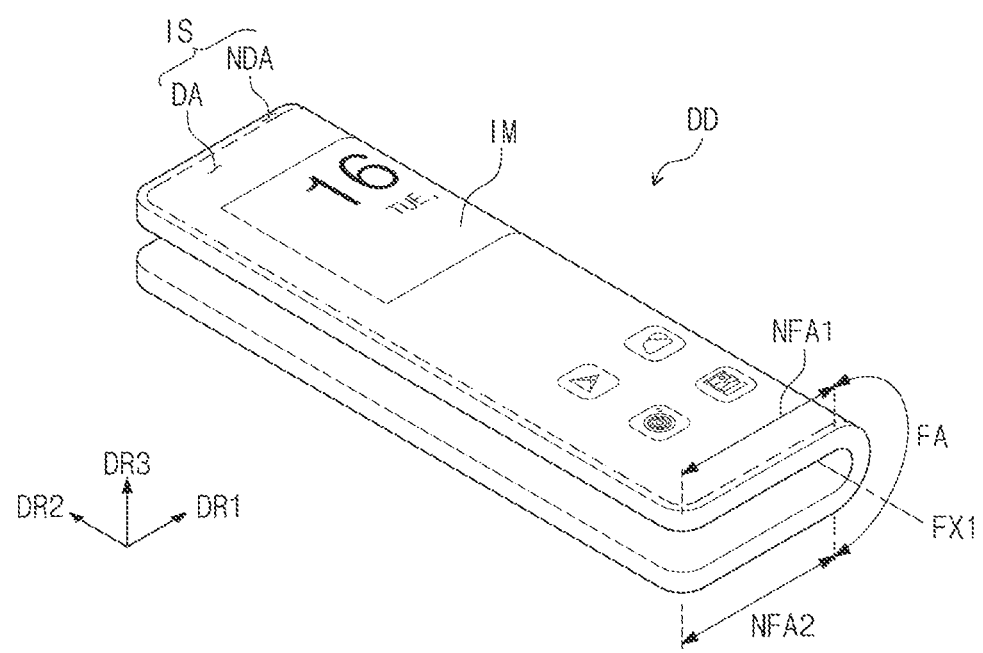

For example, referring to FIG. 17A, the display device DD of FIG. 16 may be in-folded along the first folding axis FX1. Referring to FIG. 17B, the display device DD of FIG. 16 may be out-folded along the first folding axis FX1. In this specification, the in-folding refers to folding so that the display surfaces IS face each other, and out-folding refers to folding so that the other surfaces BF of the display device DD face each other.

A plurality of areas may be defined on the display device DD according to an operation type. For example, a folding area FA and at least one non-folding area NFA1 and/or NFA2 may be defined on the display device DD. The folding area FA may be defined between the non-folding areas NFA1 and NFA2.

The non-folding areas NFA1 and NFA2 according to some embodiments may include a first non-folding area NFA1 and a second non-folding area NFA2. The first non-folding area NFA1 may be adjacent to one side of the folding area FA in the first direction DR1, and the second non-folding area NFA2 may be adjacent to the other side of the folding area FA in the first direction DR1.

Figure 18A:
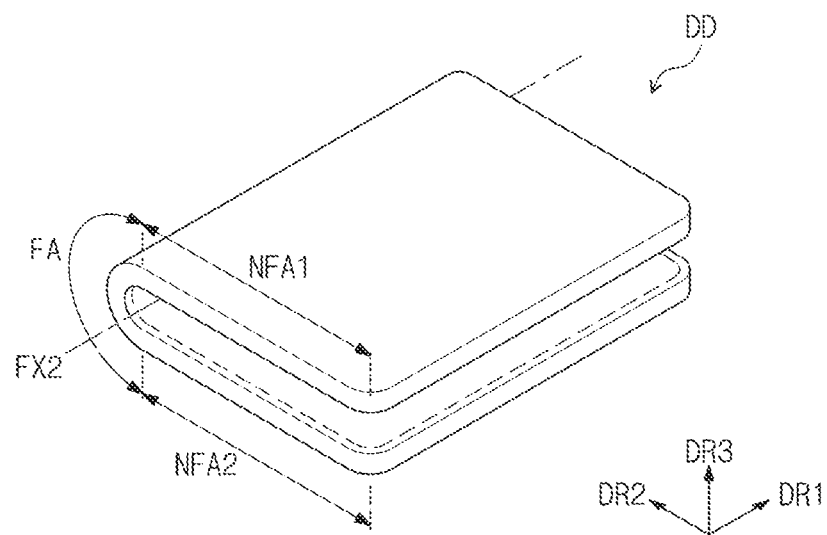
Figure 18B:
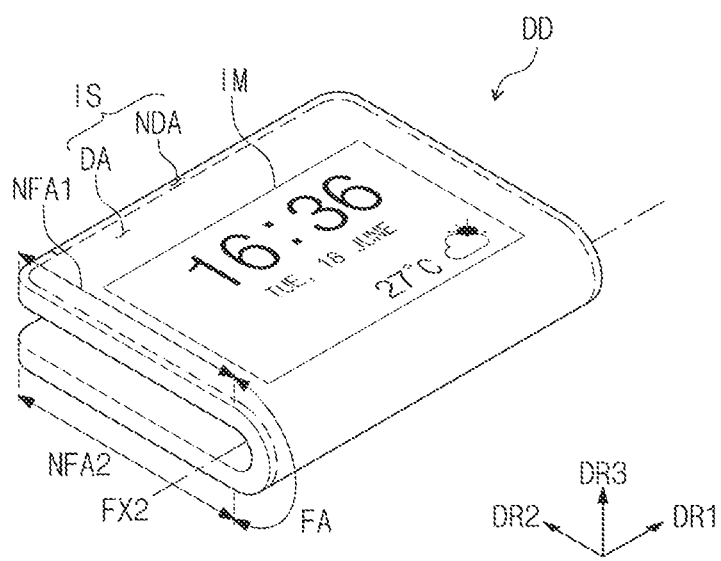

For example, referring to FIG. 18A, the display device DD illustrated in FIG. 16 may be in-folded along the second folding axis FX2. Referring to FIG. 18B, the display device DD illustrated in FIG. 16 may be out-folded along the second folding axis FX2.

Figure 19A:
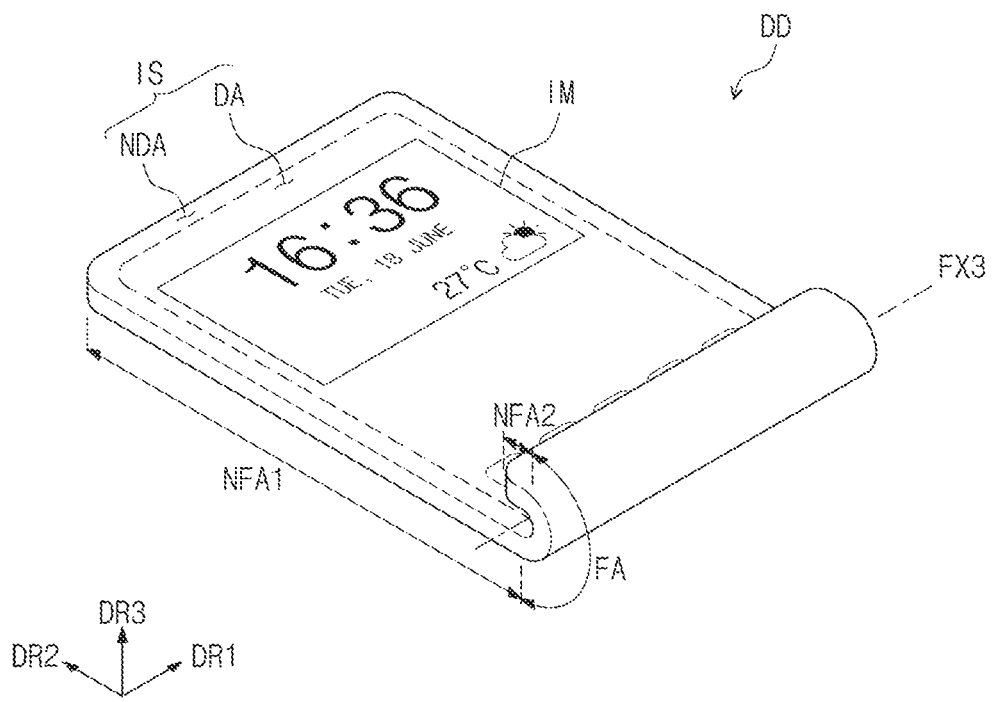
Figure 19B:
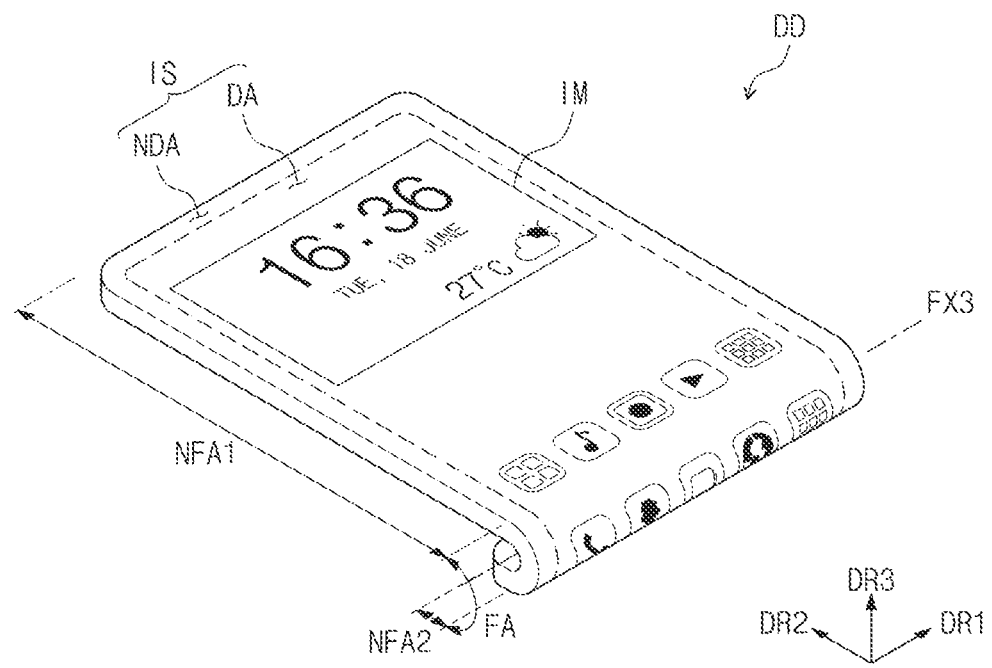
Figure 19C:
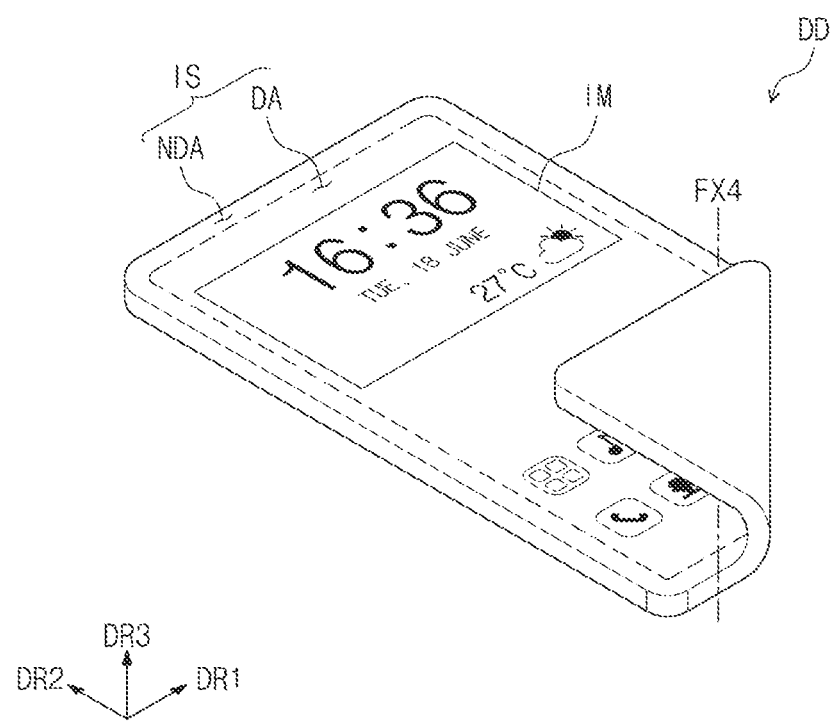

For example, referring to FIG. 19A, the display device DD illustrated in FIG. 16 may be in-folded along a third folding axis FX3. Referring to FIG. 19B, the display device DD illustrated in FIG. 16 may be out-folded along the third folding axis FX3. Referring to FIG. 19C, the display device illustrated in FIG. 16 may be in-folded along a fourth folding axis FX4. That is, the display device DD according to some embodiments may be folded in a diagonal direction. In the case of FIG. 19C, the protective pattern PF-6 of FIG. 9 may be applied.

FIGS. 17A to 19C illustrate a method of folding the display device DD as one or more examples, but the embodiments of the present disclosure are not limited thereto.

Also, although one folding area FA is defined on the display device DD, the embodiments are not limited thereto. In other embodiments, a plurality of folding areas may be defined on the display device DD.

Figure 20:
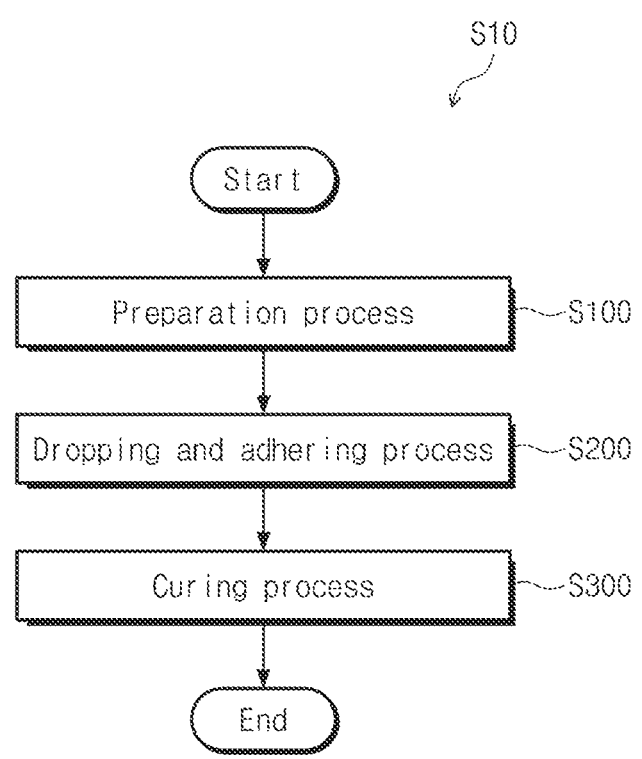
FIG. 20 is a flowchart illustrating a method for manufacturing a display device according to some embodiments of the present disclosure.

FIG. 20 is a flowchart illustrating a method (S10) for manufacturing a display device according to some embodiments of the present disclosure, and FIGS. 21A, 21B, 21C, 21D, 21E, and 21F are views illustrating processes of the method (S10) for manufacturing the display device according to some embodiments of the present disclosure, respectively.

Referring to FIG. 20, a method (S10) for manufacturing a display device according to some embodiments includes a preparation process (S100), a dropping and adhering process (S200), and a curing process (S300).

Figure 21A:
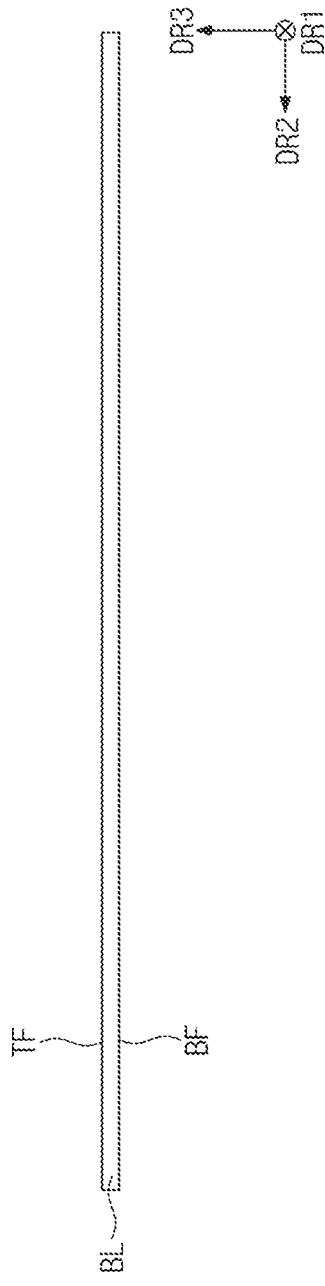
Figure 21B:
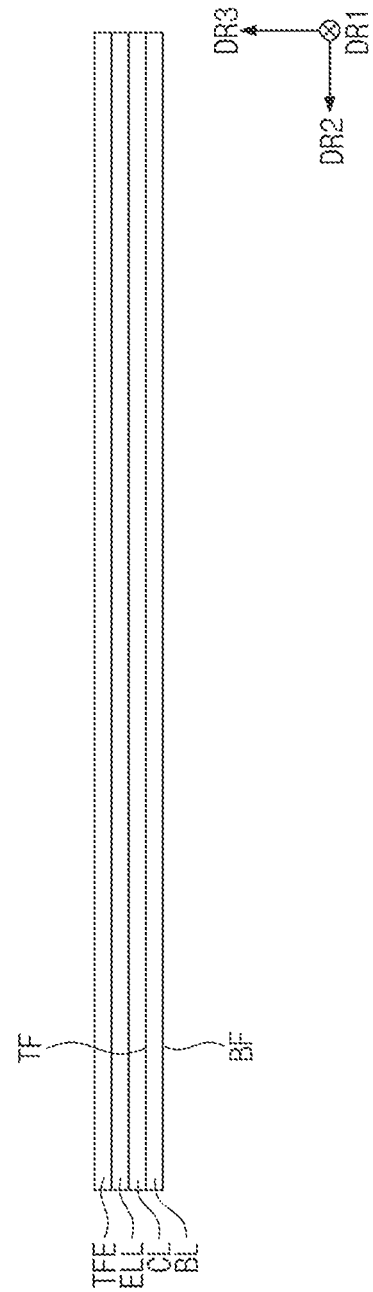

Referring to FIGS. 21A and 21B, the preparation process (S100) is a process of laminating a circuit layer CL and a light emitting element layer ELL on one surface of a base layer BL. In some embodiments, a thin film encapsulation layer TFE may be further located on the light emitting element layer ELL. For the above constituents, the description described above in FIG. 4B may be equally applied.

Figure 21C:
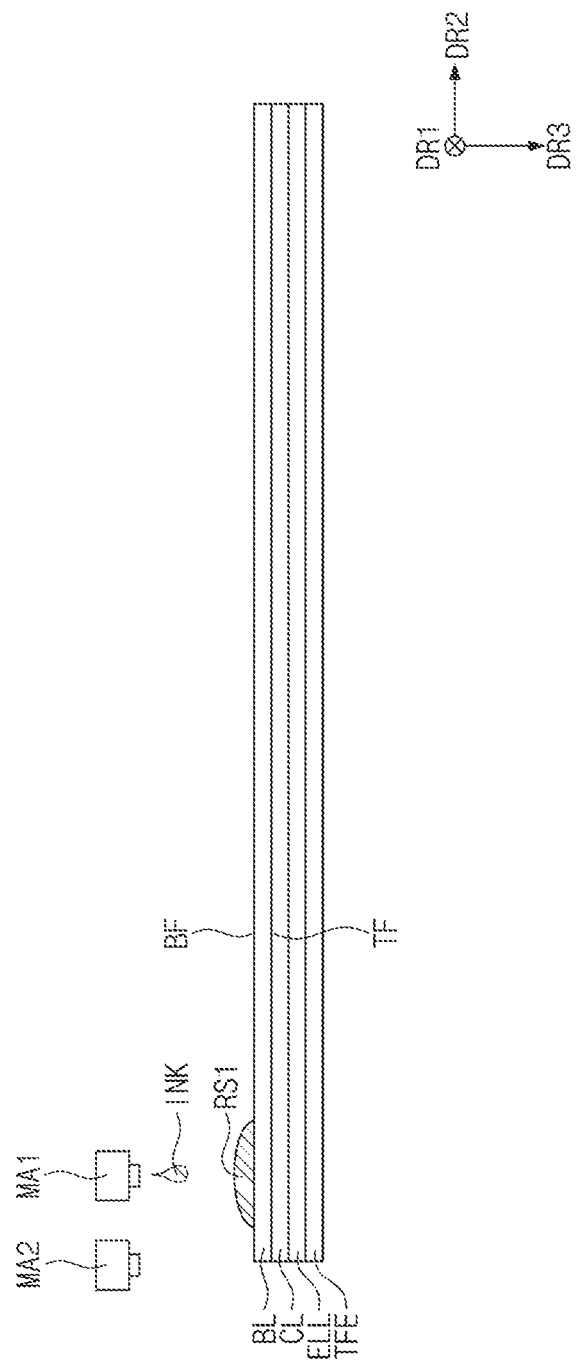

Referring to FIG. 21C, the dropping and adhering process (S200) is a dropping and adhering process of allowing an organic composition INK to drop and adhere to the other surface of the base layer BL, thereby forming an organic pattern RS1.

For example, in the dropping and adhering process (S200), the organic composition INK may drop and adhere to the other surface of the base layer BL in an inkjet manner. The organic composition INK may include at least one of an acrylate-based material, polyurethane, or polyethylene.

FIG. 21C illustrates that an inkjet device MA1 allows the organic composition INK to drop and adhere to the other surface of the base layer BL so as to form a first organic pattern RS1. An amount of organic composition INK injected from the inkjet device MA1 may be adjusted to adjust a thickness of the first organic pattern RS1. Also, the method for allowing the organic composition INK to drop and adhere may be controlled to adjust a shape of the first organic pattern RS1. In the drawings, although the first organic pattern RS1 is illustrated to have a bow shape (e.g., a semi-circle or an arch shape) on a side surface, the embodiments are not limited thereto.

Also, although one first organic pattern RS1 is illustrated in the drawing, a plurality of organic patterns overlapping the first organic pattern RS1 in the first direction DR1 are formed on the other surface BF of the base layer BL.

Figure 21D:
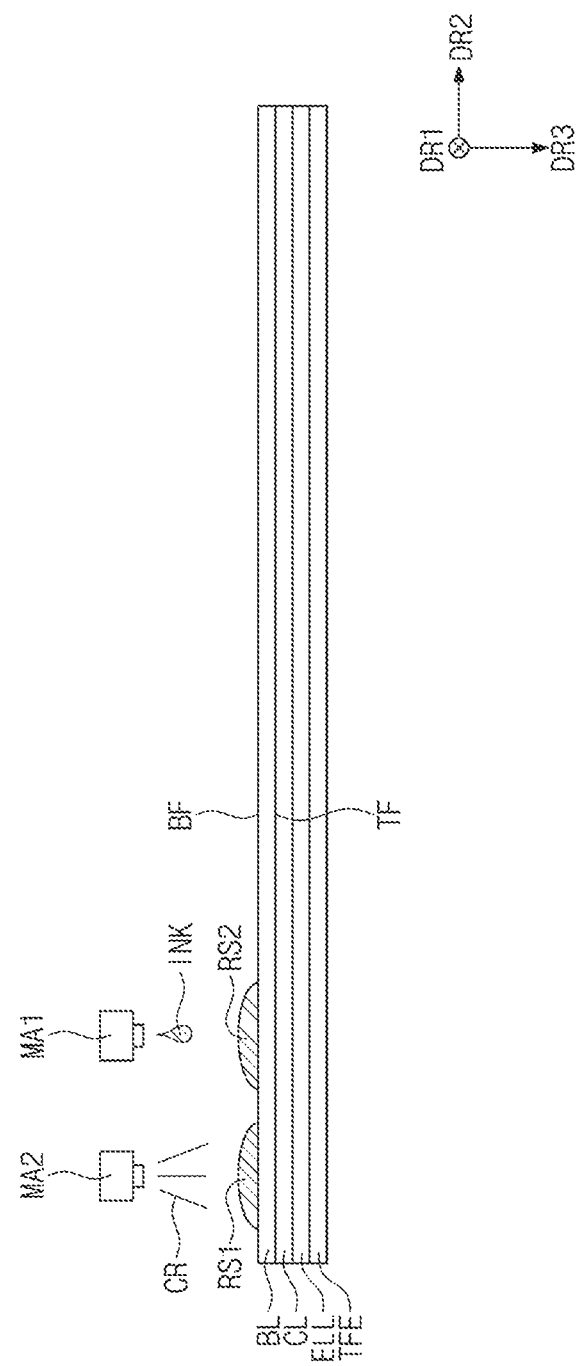
Figure 21F:
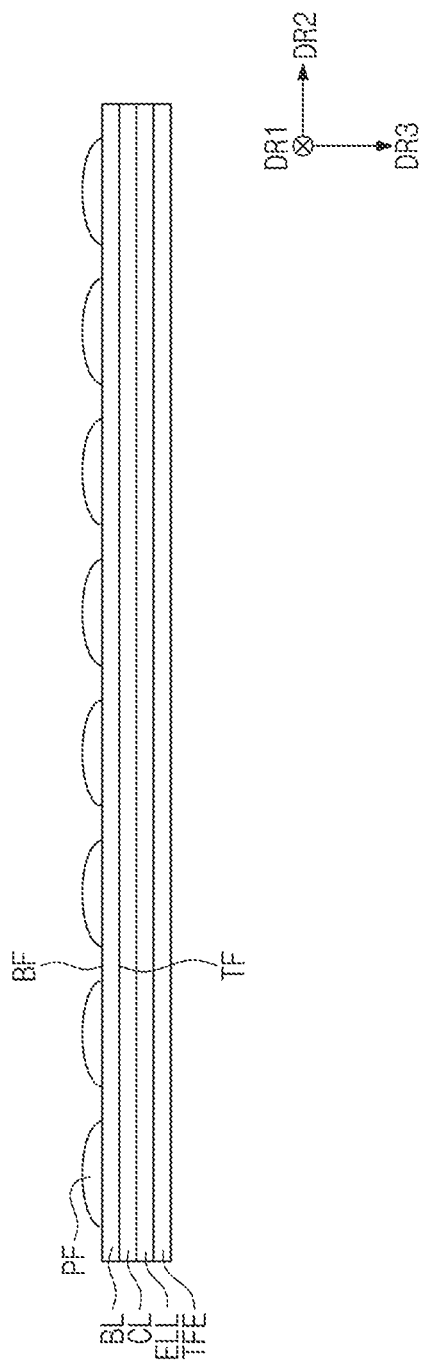

Referring to FIGS. 21D and 21E together, the curing process S300 is a process of curing the organic pattern RS1. FIG. 21D illustrates that a curing device MA2 irradiates light CR to the first organic pattern RS1. For example, the light CR may be ultraviolet ray (UV). Referring to FIG. 21E, the first organic pattern RS1 may be cured to form a protective pattern PF. The protective pattern PF may be in contact with the other surface of the base layer BL without a separate adhesive material.

In the method (S10) for manufacturing a display device according to some embodiments, the dropping and adhering process of the inkjet device MA1 and the curing process of the curing device MA2 may occur continuously (e.g., substantially concurrently). A time between a time point of the dropping and adhering and a time point of the curing of the inkjet composition INK may be adjusted to variously adjust a degree of spreading and a size of the first organic pattern RS1.

Referring again to FIG. 21D, the method (S10) for manufacturing the display device according to some embodiments may further include a dropping and adhering process of forming a second organic pattern RS2 after the dropping and adhering process (S200) of forming the first organic pattern RS1. For example, after the dropping and adhering process (S200) of the first organic pattern RS1, the curing process (S300) of the first organic pattern RS1 and the dropping and adhering process (S300) of the second organic pattern RS2 may be performed at substantially the same time.

When the curing device MA2 cures the first organic pattern RS1, the inkjet device MA1 may allow the ink composition INK to drop and adhere to the other surface BF of the base layer BL so as to form the second organic pattern RS2. The second organic pattern RS2 may be formed to overlap the first organic pattern RS1 in the second direction DR2. Also, the first organic pattern RS1 and the second organic pattern RS2 may overlap each other in the second direction DR2.

Also, referring to FIG. 21E, a process of allowing the curing device MA2 to cure the second organic pattern RS2 may be further performed. Likewise, when the curing device MA2 cures the second organic pattern RS2, the inkjet device MA1 may allow the ink composition INK to drop and adhere to the other surface BF of the base layer BL so as to form a third organic pattern RS3.

If the above-described processes are repeated, as illustrated in FIG. 21, a plurality of protective patterns PF may be formed on the other surface BF of the base layer BL.

The display device according to some embodiments of the present disclosure may include a protective pattern located on the other surface of the base layer to improve supporting force of the base layer, and may also improve flexible characteristics.

In addition, in the method for manufacturing the display device according to some embodiments of the present disclosure, the protective patterns may be formed on the other surface of the base layer in the inkjet method to variously adjust the shape and the size of each of the protective patterns and a spaced distance between the protective patterns.

In the display device according to some embodiments of the present disclosure, the damage of the display device when folded may be reduced or minimized.

In the method for manufacturing the display device according to some embodiments of the present disclosure, the display device having the improved reliability may be provided.

It will be apparent to those skilled in the art that various modifications and variations can be made from the disclosed embodiments. Thus, it is intended that the present disclosure covers the modifications and variations of the disclosed embodiments provided they come within the scope of the appended claims and their equivalents. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A display device comprising:
   a display panel at least partially bent, folded, or rolled;
   a plurality of organic patterns located directly under the display panel and spaced from each other;
   a plurality of separation spaces respectively defined between the organic patterns;
   at least one of a heat dissipation layer or a cushion layer below the plurality of organic patterns; and
   a window on the display panel,
   wherein the plurality of organic patterns and the plurality of separation spaces are defined alternately with each other,
   wherein each of the plurality of organic patterns has a flexibility, and
   wherein a lower surface of each of the plurality of organic patterns is convex in a direction away from the display panel.

2. The display device of claim 1, wherein each of the plurality of organic patterns has a bow shape.

3. The display device of claim 1, wherein each of the plurality of organic patterns comprises UV curable resin.

4. The display device of claim 1, wherein each of the plurality of organic patterns comprises acrylate-based materials, polyurethane, or polyethylene.

5. The display device of claim 1, wherein each of the plurality of organic patterns has a thickness of about 10 μm to about 100 μm.

6. The display device of claim 1, wherein the display panel comprises a first peripheral area, a second peripheral area, and a bending area between the first peripheral area and the second peripheral area and configured to be bent, folded, or rolled, and wherein the plurality of organic patterns comprises a plurality of first organic patterns overlapping the first peripheral area and a plurality of second organic patterns overlapping the second peripheral area.

7. The display device of claim 6, further comprising a circuit board on the display panel in the second peripheral area,
wherein the display panel further comprises a light emitting element layer in the first peripheral area.

8. The display device of claim 6, wherein the plurality of organic patterns comprises a plurality of third organic patterns overlapping the bending area, and
wherein a density per unit area of the plurality of third organic patterns is less than a density per unit area of the plurality of first organic patterns or the plurality of second organic patterns.

9. The display device of claim 6, wherein the first peripheral area and the second peripheral area of the display panel are folded or rolled.

10. A display device comprising:
a display panel comprising a connection part having a reduced width in a first direction and a non-connection part adjacent to the connection part; and
a plurality of organic patterns located directly under the non-connection part and spaced from each other,
wherein the connection part is partially bent, folded, or rolled, and
wherein each of the plurality of organic patterns has a flexibility.

11. The display device of claim 10, wherein the display panel comprises a light emitting element, and a circuit layer comprising a plurality of signal lines for driving the light emitting element, and
wherein a density per unit area of the plurality of signal lines in the connection part is higher than a density per unit area of the plurality of signal lines in the non-connection part.

12. The display device of claim 10, wherein the plurality of organic patterns is not located below the connection part.

13. The display device of claim 10, further comprising a plurality of connection organic patterns located below the connection part.

14. The display device of claim 13, wherein a material included in each of the plurality of connection organic patterns is the same as a material included in each of the plurality of organic patterns.

15. The display device of claim 13, wherein each of the plurality of connection organic patterns extends in the first direction, and
wherein the plurality of connection organic patterns are spaced from each other in a second direction crossing the first direction.

16. The display device of claim 13, wherein the connection part comprises a corner portion defined at an end of the first direction and a flat portion adjacent to the corner portion, and
wherein the plurality of connection organic patterns is located below the corner portion and is not located below the flat portion.

17. The display device of claim 16, wherein the plurality of connection organic patterns has a shape surrounding an end of the corner portion.

18. A display device comprising:
a base layer comprising a first portion, a second portion, and a third portion between the first portion and the second portion and configured to be bent, folded, or rolled;
a light emitting element layer on one surface of the base layer at the first portion, and comprising light emitting elements;
a circuit board on the one surface of the base layer at the third portion, and electrically connected to the light emitting elements; and
protective patterns spaced from each other in a first direction and in a second direction crossing the first direction, on another surface of the base layer, comprising a resin, and also comprising first protective patterns spaced from each other on the other surface of the base layer at the first portion, and at least one second protective pattern on the other surface of the base layer at the second portion.

* * * * *